United States Patent
Yu et al.

(10) Patent No.: US 7,262,716 B2
(45) Date of Patent: Aug. 28, 2007

(54) ASYNCHRONOUS SAMPLE RATE CONVERTER AND METHOD

(75) Inventors: Xianggang Yu, Austin, TX (US); Terry L. Sculley, Austin, TX (US); Jung-Kuei Chang, Austin, TX (US)

(73) Assignee: Texas Instruments Incoporated, Dallas, TX (US)

( * ) Notice: Subject to any disclaimer, the term of this patent is extended or adjusted under 35 U.S.C. 154(b) by 1165 days.

(21) Appl. No.: 10/325,202

(22) Filed: Dec. 20, 2002

(65) Prior Publication Data

US 2004/0120361 A1 Jun. 24, 2004

(51) Int. Cl.
*H03M 7/00* (2006.01)

(52) U.S. Cl. .................. 341/61; 370/538; 370/543; 370/545; 708/290; 708/300; 708/313

(58) Field of Classification Search .............. 341/61
See application file for complete search history.

(56) References Cited

U.S. PATENT DOCUMENTS

| | | | |
|---|---|---|---|
| 4,630,034 A * | 12/1986 | Takahashi | 341/61 |
| 5,119,093 A * | 6/1992 | Vogt et al. | 341/123 |
| 5,475,628 A | 12/1995 | Adams et al. | 364/724.1 |
| 5,666,299 A | 9/1997 | Adams et al. | 364/724.011 |
| 6,005,901 A * | 12/1999 | Linz | 375/355 |
| 6,141,671 A | 10/2000 | Adams et al. | 708/313 |
| 6,208,671 B1 | 3/2001 | Paulos et al. | 370/545 |
| 6,531,970 B2 * | 3/2003 | McLaughlin et al. | 341/61 |

OTHER PUBLICATIONS

Analog Devices AD1896 192 kHz Stereo Asynchronous Sample Rate Converter, Analog Devices, Inc., 2001, pp. 1-24.
"Discrete-Time Signal Processing" by Alan V. Oppenheim and Ronald W. Schafer, Prentice-Hall International, Inc., 1989, pp. 102-115.

* cited by examiner

*Primary Examiner*—Khai M. Nguyen
(74) *Attorney, Agent, or Firm*—Wade J. Brady, III; Frederick J. Telecky, Jr.

(57) ABSTRACT

An asynchronous sample rate converter interpolates and filters a digital audio input signal to produce a filtered, up-sampled first signal. A FIFO memory receives the first signal and stores samples thereof at locations determined by a write address and presents stored samples from locations determined by a read address. The presented samples are passed through an interpolation and resampling circuit to produce a continuous-time signal which is re-sampled to produce a signal that is up-sampled relative to a desired output. That signal then is filtered and down-sampled to produce the output signal. Sample rate estimating circuitry computes a difference signal representative of a time at which a data sample of the audio input signal is received and a time at which a corresponding audio output sample is required, and address generation circuitry generates the read and write addresses. A coefficient calculation circuit calculates filter coefficients for the interpolation and resampling circuit in response to the difference signal.

24 Claims, 9 Drawing Sheets

VALUES OF CURVES AT TIME t:
r0=y5((n-0)T)h(t-(n-0)T)
r1=y5((n-1)T)h(t-(n-1)T)
r2=y5((n-2)T)h(t-(n-2)T)
r3=y5((n-3)T)h(t-(n-3)T)
r4=y5((n-4)T)h(t-(n-4)T)

ASYNCHRONOUS SAMPLE RATE CONVERTER AND METHOD

BACKGROUND OF THE INVENTION

The present invention relates generally to sample rate converters, and more particularly to asynchronous sample rate converters and methods.

The digital audio format has become more and more popular for use in most audio signal applications, especially in applications for audio recording studios. In audio recording studios, various analog audio sources often are sampled at various different sample frequencies and then are digitized to produce various digital audio signals. In the digital format, the audio signals can be edited, reproduced and processed easily without introducing nearly as much distortion and noise as would be introduced if the same the same editing, reproducing and processing were to be performed on the same audio signals in analog format.

However, sample rate converters are necessary for interfacing between devices receiving and/or producing digital signals having different sample rates in order to avoid audio sample dropping or sample repeating, which results in highly undesirable audible "popping" or "clicking" sounds. Even for two devices that receive and/or produce digital signals having the same nominal sample rates but which are based on asynchronous clocks, it is necessary to use an asynchronous sample rate converter to accomplish interfacing between the two devices in order to avoid audio sample dropping or repeating.

There are two well-known kinds of sample rate converters: synchronous sample rate converters and asynchronous sample rate converters. In synchronous sample rate converters, an input sample rate is related to an output sample rate by a ratio of integers. This means that the sample rate of the output signal is locked to, i.e., is synchronized with, the sample rate of the input signal. However, in asynchronous sample rate converters it is not necessary that the sample rate of the output signal be synchronized with the sample rate of the input signal. Asynchronous sample rate converters each receive a stream of input samples, process them and produce output samples when requested, and can be used to convert between any two sample rates irrespective of whether the ratio of the two sample rates is an integer or is a rational number, and irrespective of whether the two sample rates are synchronized.

Because of this feature, an asynchronous sample rate converter can decouple a first digital audio device producing a digital output having a first sample rate and a second digital audio device which is intended to receive the output of the first digital audio device and sampling it at a second sample rate. For example, the sample rate of an audio source device might be 48 kHz, and the desire and d sample rate for an audio destination device might also be 48 kHz, but the clock signals of the audio source device and the audio destination device might be independent and therefore asynchronous. Then, even though the nominal sample rates both are 48 kHz, a very small drift or difference between the frequencies of the above-mentioned clock signals will accumulate and cause the above-mentioned undesirable/annoying sample dropping or sample repeating if a synchronous sample rate converter is used.

However, if an asynchronous sample rate converter is placed between the output of the audio source device and the input of the audio destination device, this effectively decouples them and avoids the effects of the inevitable relative drift between the frequencies of the two independent 48 kHz clock signals. Because of this advantage and the availability of more digital audio sources, the market demand for asynchronous sample rate converters is growing rapidly.

One prior asynchronous sample rate converter, marketed by Cirrus Logic, Inc., by design does not have phase matching. (The term "phase matching" means that multiple asynchronous sample rate converters operating in parallel introduce the same or almost the same delay with respect to their input signals.) Furthermore, the Cirrus Logic asynchronous sample rate converter requires two phase locked loop circuits (either on or off chip), one related to the input sample rate and the other related to the output sample rate. Since a phase locked loop is an analog circuit, the performance of the sample rate converter is affected by temperature, power supply voltage, and integrated circuit manufacturing process being utilized. Furthermore, use of analog phase locked loop circuits usually requires substantially more silicon chip area than would be required if digital techniques were used instead for the same purpose. Also, Cirrus Logic's sample rate converter has its decimation filter turned on all of the time. This has the disadvantage that the overall group delay of the asynchronous sample rate converter is greater than necessary in cases in which there is no aliasing for down-sampling.

Another prior asynchronous sample rate converter marketed by Analog Devices Inc. has only one stage for interpolation, which makes it difficult to achieve large attenuation of images with a reasonable filter length. In the Analog Devices asynchronous sample rate converter, the interpolation filter is very long, and has at least 4,194,304 taps to provide 125 dB attenuation. The amount of attenuation directly affects the total harmonic distortion plus noise (THD+N) performance of the asynchronous sample rate converter. The single stage interpolation filter interpolates the input samples by a ratio of up to $2^{16}$, resulting in the unreasonably long FIR lowpass filter mentioned above.

When the output sample rate is less than the input sample rate, the interpolation filter coefficients have to be interpolated by the ratio of the output sample rate to the input sample rate to make the passband of the interpolation filter narrower to avoid aliasing. Consequently, the interpolation filter length and coefficients have to be recalculated based on the ratio whenever the input sample rate or output sample rate changes. This may cause a substantial of amount of phase mismatch for multiple parallel-running asynchronous sample rate converters even when they are put into a matched phase mode wherein one asynchronous sample rate converter is set as a master and the rest are set as slaves. The master has to send the phase information to its slaves through an audio serial interface. The Analog Devices asynchronous sample rate converters must be put into a master/slave arrangement and phase information has to be transferred from the master devices to the slave devices in order to achieve matched phase. How well the phase match is accomplished depends on how much information is transferred, and the bandwidth of the audio serial interface may limit the amount of information that can be transferred by the Analog Devices asynchronous sample rate converters.

Thus, there is an unmet need for an asynchronous sample rate converter and method that provides precise phase matching, avoids use of phase locked loop circuits the input sample rate and the output sample rate, provides adequate attenuation of images, avoids the need to have its anti-aliasing filter always turned on, provides improved THD+N performance, and/or avoids the need to recalculate the interpolation filter length whenever the input or output sample rate changes.

SUMMARY OF THE INVENTION

It is an object of the present invention to provide an asynchronous sample rate converter and method that provides precise phase matching between the input and output sampling times.

It is another object of the present invention to provide an asynchronous sample rate converter and method that avoids use of phase locked loop circuits to determine the input sample rate and the output sample rate.

It is another object of the present invention to provide an asynchronous sample rate converter and method that is not overly sensitive to drift of the input and/or output sample rates.

It is another object of the present invention to provide an asynchronous sample rate converter and method that provides adequate attenuation of images without use of excessively long interpolation filters.

It is another object of the present invention to provide an asynchronous sample rate converter and method that provide adequate attenuation of images without use of excessively long interpolation filters and avoid the need to have an anti-aliasing filter always turned on.

It is another object of the present invention to provide an asynchronous sample rate converter and method that avoid the need to recalculate the interpolation filter length whenever the input and/or output sample rate changes.

It is another object of the present invention to provide an asynchronous sample rate converter and method that provides improved THD+N (total harmonic distortion plus noise) and in performance compared to the closest prior art.

Briefly described, and in accordance with one embodiment, the present invention provides an asynchronous sample rate converter (1). A memory (6) receives samples representative of the input signal and stores samples thereof at locations determined by a write address (wraddr) and presents stored samples from locations determined by a read address (rdaddr). The presented samples are passed through an interpolation and resampling circuit (7) to produce a continuous-time signal (y6) which is re-sampled to produce a signal (y7) that is up-sampled relative to a desired output. That signal then is filtered and down-sampled to produce the output signal (y). Sample rate estimating circuitry (2A) computes a difference signal (td) representative of a time at which a data sample of the audio input signal is received and a time at which a corresponding audio output sample is required, and address generation circuitry (61) generates the read address in response to the difference signal. A coefficient calculation circuit (62) calculates filter coefficients (3) for the interpolation and resampling circuit in response to the difference signal.

The described embodiment includes an asynchronous sample rate converter (1) including interpolation filtering circuitry (8A,B) for receiving a digital audio input signal (x) having an input sample rate (fsin) and producing a filtered, up-sampled first signal (y2) having a first sample rate (4 fsin), a memory (6) for receiving the first signal (y2) and storing samples thereof at locations determined by a write address (wraddr) and presenting stored samples (y3) from locations determined by a read address (rdaddr), interpolation and resampling circuitry (7) for up-sampling and filtering the presented stored samples (y3) to produce a continuous-time signal (y6) and for resampling the continuous-time signal to produce an up-sampled discrete-time signal (y7) relative to the output sampling rate, a decimation filter (18) for filtering and down-sampling the discrete-time signal (y7) to produce an audio output signal (y) having an output sampling rate (fsout), sample rate estimating circuitry (2A) responsive to a main clock (MCLK), an input sample rate clock (LRIN), and an output sample rate clock (LROUT for a computing a difference signal (td) representative of a time at which a data sample of the audio input signal is received and a time at which a corresponding audio output sample is required, the difference signal (td) including an integer part (OFFSET) and a fractional part (tf), address generation circuitry (61) responsive to an input sampling clock (LRIN) and the integer part (OFFSET)) for generating the read address (rdaddr), and coefficient calculation circuitry (62) responsive to the fractional part (tf) for calculating filter coefficients for the interpolation and resampling circuitry (7).

In the described embodiment, the sample rate estimating circuitry (2A) includes a first counter (30) clocked by a main clock signal (MCLK) for producing a first stepped ramp signal, a first register (32) clocked by the input sampling clock (LRIN) for loading the first stepped ramp signal into the first register, and a second register (31) clocked by the output sampling clock (LROUT) for loading the first stepped ramp output signal into the second register. The sample rate estimating circuitry also includes a first feedback loop coupled to receive a second stepped ramp signal from an output of the first register (32) for filtering the second stepped ramp signal to eliminate jitter of the input sampling clock (LRIN) and to produce a first input sampling interval estimate signal (T1) and a first time stamp signal (t1) corresponding to the time of occurrence of the first sample of each group of N samples of the first signal (y2), N being an integer. The second feedback loop is coupled to receive a third stepped ramp signal from an output of the second register (31) for filtering the third stepped ramp signal to eliminate jitter of the output sampling clock (LROUT) and to produce a second time stamp signal (t2) corresponding to when a next resampling of the continuous-time signal (y6) should occur. The sample rate estimating circuitry (2A) includes difference circuitry receiving the first (t1) and second (t2) time stamp signals and the first input sampling interval estimate signal (T1) for producing the difference signal (td) in response the first and second time stamp signals. The address generation circuitry (61) includes a second counter (65) clocked by the input sample rate clock (LRIN) and providing a digital output, a first adder (69) combining the digital output of the second counter (65) with the integer part (OFFSET) to provide a digital word that is input to accumulator (70, 72) to produce the read address (rdaddr), and an index generating circuit (66) providing a digital index that is incremented to indicate sequential samples of a each of a plurality of predetermined groups of samples of the first signal (y2) in order to produce sequential values of the write address (wraddr) corresponding to sequential samples of the first signal (y2).

In the described embodiment, the memory (6) is a random access memory having an input bus coupled to receive the first signal (y2) and store samples thereof at memory locations determined by the write address (wraddr) and also having an output bus onto which data stored in the random access memory is read from memory locations determined by the read address (rdaddr). The coefficient calculation circuitry (62) includes a first adder (75), a first exponential circuit (80), and a second adder (98) all receiving an LSB portion (ta) of the difference signal (td), each adder also receiving a "1" input, the first exponential circuit (80) producing a first exponential signal (a), a read only memory address generator (85) receiving an MSB portion of the fractional part (tf), a second exponential circuit (81) receiving a scaled (99) output of the second adder (98) and producing a second exponential signal (b), a third exponential circuit (79) and the third adder (76) receiving an output (tb) of the first adder (75), the third exponential circuit (79) producing a third exponential signal (c), a fourth exponential circuit (78) receiving a scaled (77) output from the third adder (76) and producing a fourth exponential signal (d), a first multiplexer (82) sequentially applying the first (a), second (b), third (c) and fourth (d) exponential signals to an input of a multiplier (83). The read only memory address generator (85) produces addresses in first (87) and second (88) read only memories, the first read only memory (87) applies signals to another input of the multiplier (83), and the second read only memory (88) applies an output to an input of a second multiplexer (89). Outputs of the multiplier (83) and the second multiplexer (89) are added by a fourth adder (84) and loaded into a register (90), outputs of which represent the filter coefficients (3) and are fed back to another input of the second multiplexer (89).

In the described embodiment, the interpolation and resampling circuitry (7) produces the up-sampled discrete-time signal (y7) according to the equations $$y_7(mT_3) = d_0 y_4(nT) + d_1 y_4((n-1)T) + \ldots + d_{31} y_4((n-31)T)$$

where $d_0, d_1, \ldots, d_{31}$ are linear functions of a, b, c, and d as follows:

$$d_0 = a*w(0,0) + b*w(0,1) + c*w(0,2) + d*w(0,3) + w(0,4)$$
$$d_1 = a*w(1,0) + b*w(1,1) + c*w(1,2) + d*w(1,3) + w(1,4)$$
$$\vdots$$
$$d_{31} = a*w(31,0) + b*w(31,1) + c*w(31,2) + d*w(31,3) + w(31,4)$$

DETAILED DESCRIPTION OF THE PREFERRED EMBODIMENTS

Figure 1:
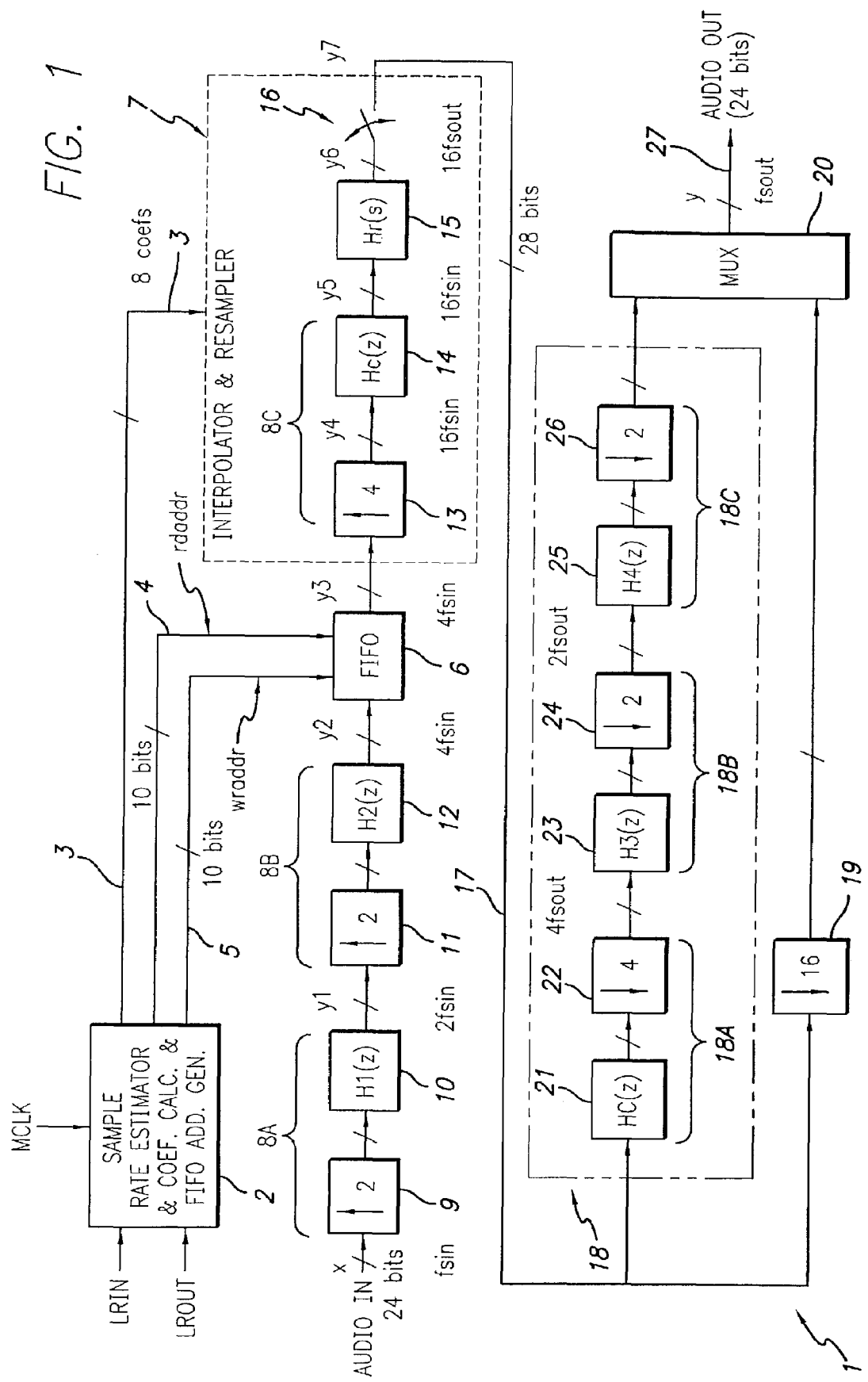
FIG. 1 is a block diagram of an asynchronous sample rate converter.

The described embodiment of the asynchronous sample rate converter 1 of the present invention as shown in the drawings is designed to operate within a range of the ratio between the input sample rate the and output sample rate from 1:16 to 16:1. Thus, asynchronous sample rate converter 1 has the capability of converting between any sample rates of Audio In (also designated by "x") and Audio Out (also designated by "y") in the range of, for example, 12 kHz to 192 kHz. Audio In, also designated by "x" in FIG. 1, is an already-digitized 24-bit version of an analog signal, and has a sample rate of fsin. Greatly simplified, an asynchronous sample rate converter can be considered to include only two main sections. The first section is to convert the signal from discrete-time to continuous-time, which is what is accomplished from the discrete-time signal Audio In to continuous-time signal y6 in FIG. 1. The second section just re-samples (but does not hold) the continuous-time signal y6. The resampling converts the continuous-time signal y6 back to digital, at a suitable multiple of the desired output sample rate.

Figure 2:
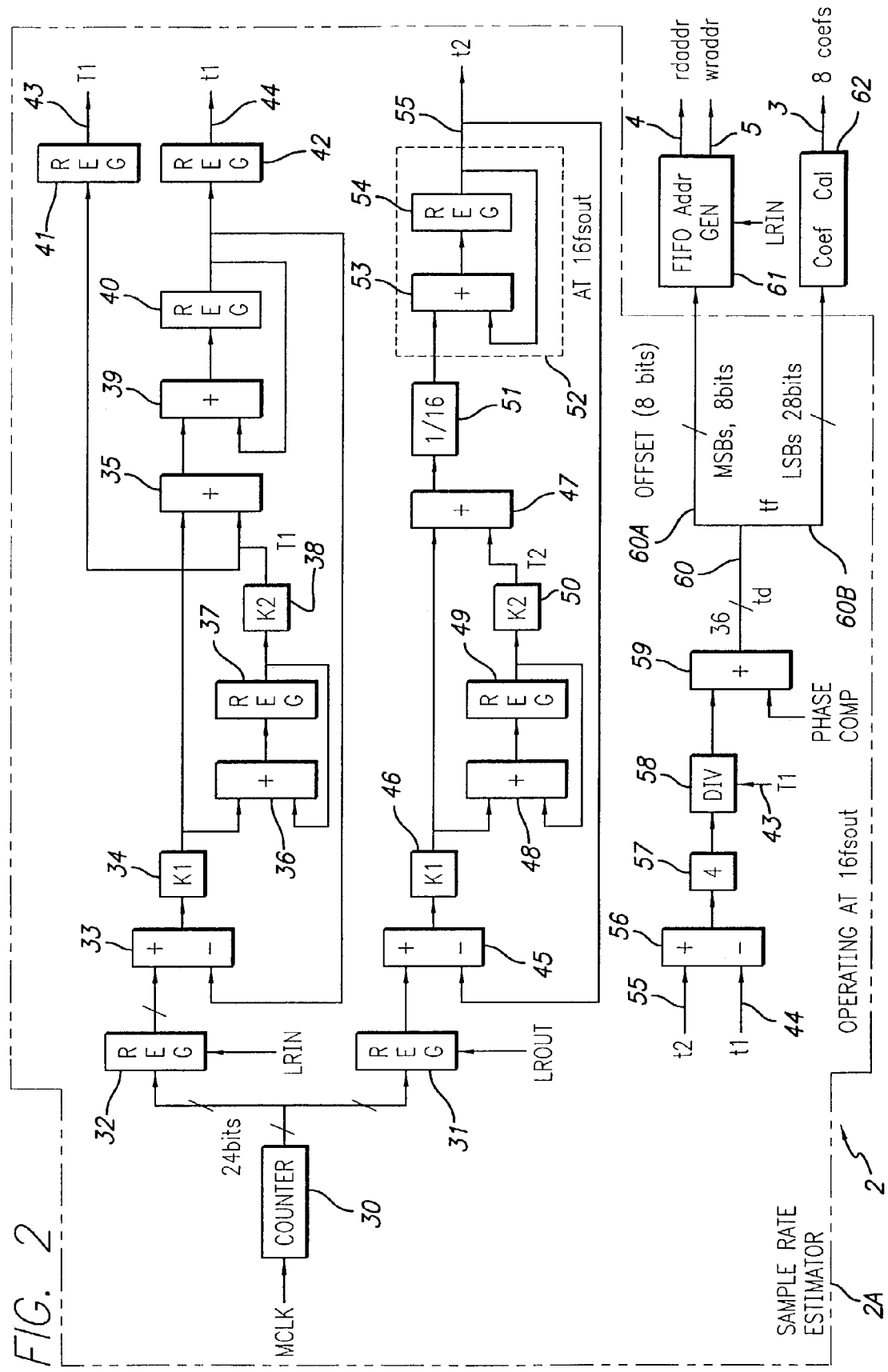
FIG. 2 is a block diagram of the sample rate estimator circuit 2 in FIG. 1.

Referring to FIG. 1, block 2 of asynchronous sample rate converter 1 includes a sample rate estimator circuit 2A, which is shown in FIG. 2. Block 2 also includes a FIFO address generator circuit 61 shown in FIG. 3 and a coefficient calculation circuit 62 shown in FIG. 4. Block 2 receives a master clock signal MCLK, an input sampling clock LRIN having a frequency equal to the input sample rate fsin, and an output sampling clock LROUT having a frequency equal to the output sample rate fsout. The sample rate estimator circuit in block 2 produces a write address wraddr on conductors 5, which are connected to the write address inputs of FIFO 6, a read address rdaddr on conductors 4 which are connected to read address inputs of FIFO 6, and eight filter coefficients on the 28 bit bus 3, which are connected to interpolator and resampler circuit 7.

A three-stage interpolator 8,A,B,C includes a first stage 8A including an up-sampling circuit 9 that up-samples Audio In (which has a sample rate of fsin) by 2 and filters the result by means of FIR (finite impulse response) filter 10, which has a transfer characteristic H1(z), to produce a signal y1 having a sample rate 2 fsin. (Filter 10 of first interpolator stage 8A needs to be a very good low pass digital filter, and subsequently described second filter 12 of second interpolation stage 8B is a "relatively good" low pass filter. Subsequently described third stage filter 14 interpolator and resampler circuit 7 includes cascaded comb filters.)

The signal y1 is input to the second interpolator stage 8B, in which up-sampling circuit 11 up-samples y1 by 2 and FIR filter 12 filters the result. FIR filter 12 has a transfer characteristic H2(z) to produce a signal y2 having a sample rate of 4 fsin.

The discrete-time signal y2 is applied to the data input of FIFO 6, which is used to store the audio samples coming out of the second interpolator stage 8B. FIFO 6 has to be large enough to store all of the audio samples to be used by the combination of third interpolator stage 8C and resampler 16 in block 7 to generate a signal y7 with a sample rate of 16*fsout for the entire range of sample rate ratios. FIFO 6 also has to store enough samples to accommodate the sample rate variation, since the two subsequently described tracking loops in FIG. 2 respond slowly in their "slow mode".

In the present design, 512 words for each of two channels are selected. Therefore the total size of FIFO 6 is 1024 words. FIFO 6 is a random access memory which is essentially a first-in-first-out memory, except that unused samples are never read out and therefore are eventually written over by new incoming samples. The 10-bit write address wraddr determines where each sample of y2 is stored in FIFO 6, and the 10-bit read address rdaddr indicates the address of samples in FIFO 6 to be used by interpolator and resampler 7 to generate a sample of y7. The output signal y3 of FIFO 6 in real-time looks very much like its input y2, but with a predetermined delay. The samples coming into FIFO 6 are at a sample rate four times that of Audio In. The 10 bits required for addressing FIFO 6 include 9 bits for addressing 512 samples in each of two channels (left and right), and 1 bit for selecting the desired channel.

FIFO 6 must be large enough to allow calculation of the values of the discrete-time signal samples y7. To calculate a sample of y7, eight samples are needed, so at least those eight samples must be stored in FIFO 3, along with additional samples that must be stored because the input sample rate and the output sample rate may be drifting and the rate estimator dynamics is slow. For example, the input samples of Audio In may arrive faster or slower than the nominal rate because of drifting, and consequently y3 is read out at a different rate than the rate at which y2 is written into FIFO 6. Therefore, FIFO 6 must be large enough to also store the additional samples of y2 required to prevent FIFO 6 from running out of data and also to prevent still-needed data in FIFO 6 from being overwritten by incoming data, either of which can happen as the input sample rate fsin and output sample rate fsout drift around each other.

FIFO 6 produces output signal y3 which is applied as an input to the third interpolator stage 8C, in which up-sampling circuit 13 up-samples y3 by 4 to produce a signal y4 having a sample rate of 16 fsin, which is filtered by comb filter 14.

Filter 14 includes 9 cascaded 4-tap comb filters. Filter 14 has a transfer function $H_c(z)$ in order to produce a signal y5 having a sample rate of 16 fsin. The signal y5 is input to a continuous-time filter 15 having a transfer function $H_r(s)$ to produce a continuous-time signal y6 that is sampled by a sampling switch 16 to produce a discrete-time signal y7 on conductors 17. Since third stage interpolator 8C and resampler 16 are combined to have 32 taps, eight samples of y3 are read out and processed for each sample of y7.

Sampling switch 16 is controlled by sample rate estimator 2A in block 2 of FIG. 1, and the calculation of the filter coefficients 3 is based on the times at which sampling switch 16 must be closed to sample continuous-time signal y6. The filter coefficients are calculated for continuous-time filter 15 on the basis of when the output y6 is needed so that it can be sampled by switch 16 to produce the next discrete-time value of y7. Sample rate estimator 2A also calculates which of the samples stored in FIFO 6 are needed to be read out in order to generate the next discrete-time value of y7. The time when y6 is sampled is indicated by t2. The timing of the samples that represent y7 are synchronized with LROUT.

Although Audio In has 24-bit resolution, the internal circuitry preferably operates with 28-bit resolution in order to maintain accuracy at the 24-bit resolution level. In the described circuitry, internal processing is performed with 28-bit resolution, and after the processing the data, is dithered and then truncated to the desired resolution. This is necessary because the subsequently described calculations result in truncations of the digital numbers and also result in injection of noise, reducing the accuracy of the least significant bits.

Output signal y7 is provided as an input to a decimator 18 and to a down-sample-by-16 circuit 19. The first stage 18A of decimator 18 receives y7 as an input which is filtered by cascaded comb filters 21 to produce an output signal that is down-sampled by 4 by means of a down-sampling circuit 22 to produce a signal having a sample rate of 4 fsout. Cascaded comb filters 21 have a transfer function $H_c(z)$. Its output signal is input to an FIR filter 23 of the second stage 18B of decimator 18. FIR filter 23 has a transfer function $H_3(z)$ and produces a signal which is down-sampled by 2 to produce a signal having a sample rate 2 fsout. That signal is input to an FIR filter 25 of the third stage 18C of decimator 18. FIR filter 25 has a transfer function $H_4(z)$ and produces a signal which is down-sampled by 2 by means of a down-sampling circuit 26 to produce a signal having a sample rate of fsout that is input to one input of a multiplexer 20. The signal y7 can be down-sampled by 16 by means of a down-sampling circuit 19 to produce another signal having a sample rate of fsout which is applied to a second input of multiplexor 20.

Either decimation filter 18 or down-sampler 19 is used to produce the desired Audio Out signal at the desired sample rate fsout, depending on whether fsin is greater than or less than fsout. Multiplexor 20 produces a 24-bit signal "y" that constitutes the output signal Audio Out on conductors 27. If fsout always is greater than fsin, then there can be no aliasing, so there is never a need for anti-alias filtering in order to produce Audio Out. Therefore, only down-sampler 19 is needed to produce Audio Out, and this has the advantage of avoiding the group delay associated with decimator 18. However, if fsout is less than fsin, then aliasing occurs and both down-sampling and filtering are needed, but the delay associated with decimator 18 is introduced into the signal path. The down-sampling in the two cases is shown in waveforms H and I of FIG. 11. The user can decide whether to use down-sampler 19 or decimation filter 18.

To summarize, the main components of asynchronous sample rate converter 1 include three-stage interpolator 8A,B,C, continuous-time filter 15 resampler 16, decimator 18, sample rate estimator including its FIFO address generator 61 and its coefficient calculation circuit 62, and FIFO (first in, first-out) circuit 6. Three stage interpolator 8A,B,C interpolates the input Audio In samples up by 16. Resampler 16 produces samples at 16 times of the output sample rate with adequate image attenuation. Decimator 18 reduces the sample rate of the samples output from resampler 16 from 16 fsout to fsout with anti-aliasing filters (which is optional). Sample rate estimator 2A estimates the input sample rate and the output sample rate and their timing relationship, and based on this information, calculates the eight filter coefficients 3 for the combination of the third stage interpolator and the resampler 16, and the audio samples to be used are selected by the FIFO address generator 61. FIFO 6 is used to store intermediate audio samples, and has to be large enough to store enough samples to avoid overflow or underflow caused by drift of the sampling frequency.

Three-stage interpolator 8A,BC is designed to increase the sample rate by 16 of the data stream Audio In with adequate attenuation of images. First stage 8A and second stage 8B both up-sample the audio stream by 2 and pass the stream to above mentioned low-pass FIR filters 10 and 12, respectively, to remove the images. The output spectrums of FIR filters 10 and 12 are shown by waveforms B and C, respectively, in FIG. 11.

Figure 11:
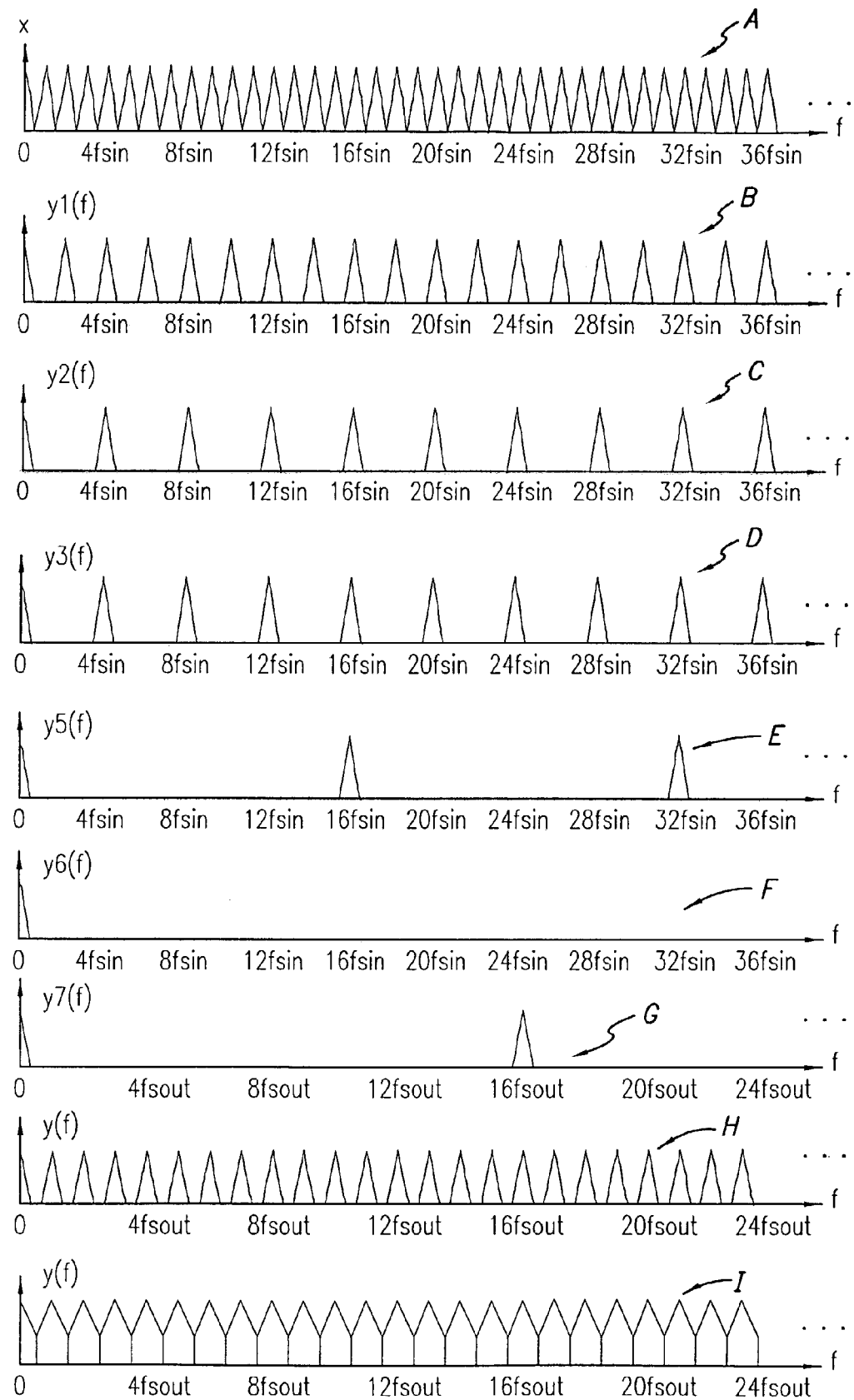
FIG. 11 includes a plurality of graphs illustrating the signal spectrum of various signals in the asynchronous sample rate converter of FIG. 1.

Nine cascaded 4-tap comb filters are included in the third interpolation stage 8C to remove the images caused from the up-sampling by 4, and the output spectrum of filter 14 is shown by plot E in FIG. 11. Note that in a practical implementation the third stage interpolation output signal y5 does not actually exist physically, because the third interpolation stage 8C and a continuous-time filter 15 with the transfer function Hr(s) are combined together as subsequently explained. (Note that "s" is used as the argument of the transfer function to indicate that filter 15 is a continuous-time filter, whereas "z" is used as the argument of the other transfer functions to indicate that the other filters are discrete-time filters.)

Figure 6:
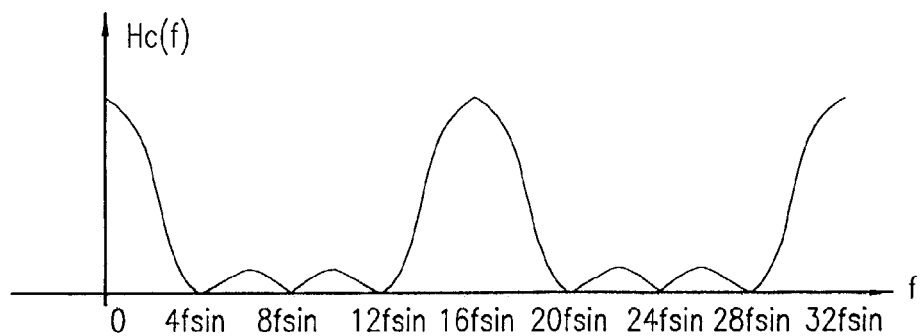
FIG. 6 is a graph illustrating the frequency response of the third stage interpolation filter 14 of FIG. 1.

The transfer function of third stage interpolation filter 14 is:

$$Hc(z) = \left(\frac{1}{4}(1 + z^{-1} + z^{-2} + z^{-3})\right)^9 = c_0 z^0 + c_1 z^{-1} + \cdots + c_{27} z^{-27} \quad \text{Equation (1)}$$

where c0, c1, ..., and c27 are constants. The filter 14 in third interpolation stage 14 has a total of 28 taps. Its comb filter frequency response is shown in the graph of FIG. 6.

The continuous-time filter 15 has the transfer function Hr(s), and is followed by sampling switch 16. Continuous-time filter 15 receives the discrete-time signal y5, and functions in response thereto somewhat like a digital-to-analog converter to produce the continuous-time signal y6. Continuous-time filter 15 is a 4th-order sample/hold device having the transfer function:

$$Hr(s) = \left(\frac{1 - e^{-sT}}{sT}\right)^5 = \frac{1 - 5e^{-sT} + 10e^{-2sT} - 10e^{-3sT} + 5e^{-4sT} - e^{-5sT}}{(sT)^5} \quad \text{Equation (2)}$$

where T=1/(16 fsin).

Figure 7:
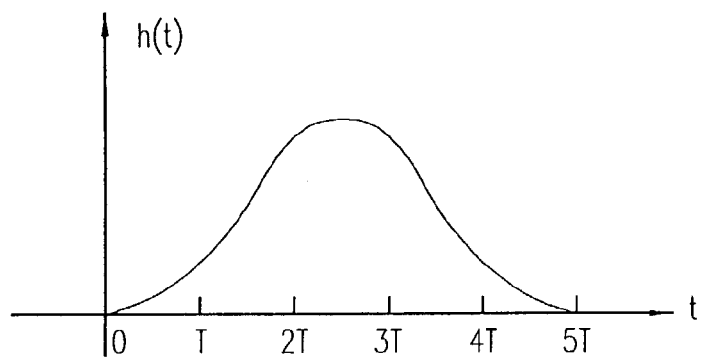
FIG. 7 is a graph of the impulse response of the continuous-time filter 15 of FIG. 1.

The normalized impulse response of continuous-time filter 15 is:

$$h(t) = \frac{1}{4!}((t/T)^4 u(t) - 5(t/T - 1)^4 u(t/T - 1) + 10(t/T - 2)^4 u(t/T - 2) - 10(t/T - 3)^4 u(t/T - 3) + 5(t/T - 4)^4 u(t/T - 4) - (t/T - 5)^4 u(t/T - 5)) \quad \text{Equation (3)}$$

where u(t) is the unit step function. The plot of h(t) is shown in FIG. 7.

The frequency response of continuous-time filter 15 is:

$$H_r(f) = \left(\frac{\sin(\pi fT)}{\pi fT}\right)^5 = (\text{sinc}(fT))^5 \quad \text{Equation (4)}$$

Figure 8:
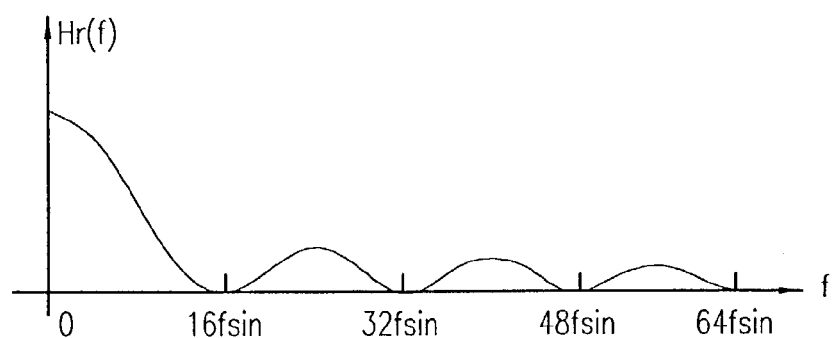
FIG. 8 is a graph of the frequency response of the continuous-time filter 15 of FIG. 1.
Figure 9:
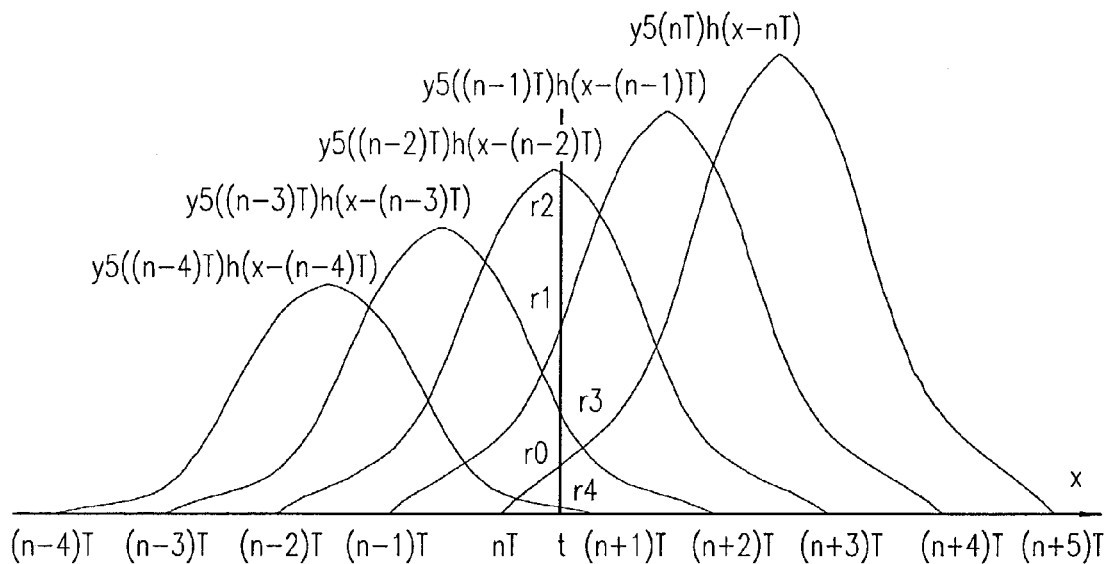
FIG. 9 is a graph illustrating calculation of the output of the continuous-time filter 15 of FIG. 1.

The plot of the frequency response of continuous-time filter 15 is shown in FIG. 8, which shows that there are notches at the multiples of 16 fsin which will remove the images in the discrete-time signal y5 at those frequencies. The process of calculating the output y6 of continuous-time filter 15 is shown in FIG. 9 for all discrete-time input sample sequences of y5(nT). Each input sample of the sequences generates a continuous-time impulse response curve which starts at the time of the sample entering continuous-time filter 15, and the amplitude of the impulse response curve h(x) is scaled by the sample value. The summation of all the curve values at time t is equal to the output y6 of continuous-time filter 15 at time t. At any point, there are exactly 5 such curves that are summed to provide the output y6. The output of continuous-time filter 15 at time t, $nT \leq t < (n+1)T$, is equal to:

$$y_6(t) = h_0 y_5(nT) + h_1 y_5((n-1)T) + h_2 y_5((n-2)T) + h_3 y_5((n-3)T) + h_4 y_5((n-4)T)$$

where $$h_0 = h(t-nT)$$

$$h_1 = h(t-(n-1)T)$$

$$h_2 = h(t-(n-2)T)$$

$$h_3 = h(t-(n-3)T)$$

$$h_4 = h(t-(n-4)T) \quad \text{Equations (5)}$$

If we define:

$$t = (t_a + n)T$$

$$0 \leq t_a < 1$$

$$t_b = 1 - t_a$$

$$a = t_a^4$$

$$b = (0.5 + 0.5 * t_a)^4$$

$$c = t_b^4$$

$$d = (0.5 + 0.5 * t_b)^4 \quad \text{Equations (6)}$$

then the discrete-time signal y7 is obtained as:

$$y_7(mT_3) = y_6(t)|_{t=(t_a+n)T} = h_0 y_5(nT) + h_1 y_5((n-1)T) + h_2 y_5((n-2)T) + h_3 y_5((n-3)T) + h_4 y_5((n-4)T)$$

where $$m = (t_a + n)\frac{T}{T_3}, \quad T_3 = \frac{1}{16 fsout}, \quad \text{Equation (7)}$$

and h0, h1, h2, h3, and h4 are as follows:

$$h_0 = h(t_a T)$$

$$h_1 = h((t_a + 1)T)$$

$$h_2 = h((t_a + 2)T)$$

$$h_3 = h((t_a + 3)T)$$

$$h_4 = h((t_a + 4)T) \quad \text{Equations (8)}$$

After some algebraic manipulations, h0, h1, h2, h3 and h4 can be converted to linear functions of a, b, c and d.

The following equations relate to interpolator and resampler circuit 7 which is a combination of third interpolation stage 8C and resampler 16. From Equation (1), it follows that:

$$y_5(nT)=c_0y_4(nT)+c_1y_4((n-1)T)+\ldots+c_{27}y_4((n-27)T)$$

$$y_5((n-1)T)=c_0y_4((n-1)T)+c_1y_4((n-2)T)+\ldots+c_{27}y_4((n-28)T)$$

$$y_5((n-2)T)=c_0y_4((n-2)T)+c_1y_4((n-3)T)+\ldots+c_{27}y_4((n-29)T)$$

$$y_5((n-3)T)=c_0y_4((n-3)T)+c_1y_4((n-4)T)+\ldots+c_{27}y_4((n-30)T)$$

$$y_5((n-4)T)=c_0y_4((n-4)T)+c_1y_4((n-5)T)+\ldots+c_{27}y_4((n-31)T) \quad \text{Equations (9)}$$

Substituting Equations (9) into Equation (7) gives:

$$y_7(mT_3)=d_0y_4(nT)+d_1y_4((n-1)T)+\ldots+d_{31}y_4((n-31)T) \quad \text{Equation (10)}$$

where d0, d1, . . . , d31 are linear functions of a, b, c, and d as follows:

Equation (11)

$$d_0 = a*w(0,0) + b*w(0,1) + c*w(0,2) + d*w(0,3) + w(0,4)$$
$$d_1 = a*w(1,0) + b*w(1,1) + c*w(1,2) + d*w(1,3) + w(1,4)$$
$$\vdots$$
$$d_{31} = a*w(31,0) + b*w(31,1) + c*w(31,2) + d*w(31,3) + w(31,4)$$

where w(i, j) for i=0, . . . , 31 and j=0, . . . , 4 are constants.

Figure 10:
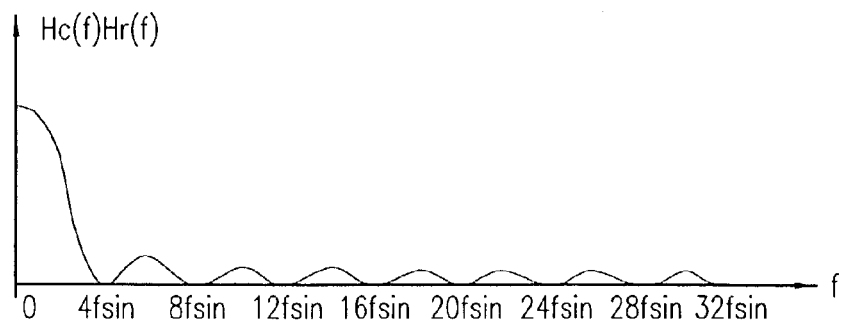
FIG. 10 is a graph of the frequency response of the third stage interpolation and resampler circuit of FIG. 1.

From FIGS. 6 and 8, the frequency response of the combination of Hc(z) and Hr(s) can be obtained as shown in FIG. 10, which shows that the frequency response has notches at multiples of 4 fsin.

Since y4 is the result of up-sampling y3 by 4, this means that 3 out of every 4 samples of y4 are zeroes and only one sample of every 4 is nonzero. Therefore, it is necessary to calculate only 8 coefficients from d0, d1, . . . , and d31 to obtain y7(mT3). There are four groups of the coefficients:

Group1: d0, d4, d8, d12, d16, d20, d24 and d28;
Group2: d1, d5, d9, d13, d17, d21, d25 and d29;
Group3: d2, d6, d10, d14, d18, d22, d26 and d30;
Group4: d3, d7, d11, d15, d19, d23, d27 and d31;

Therefore, each time it is necessary to calculate only one of 4 group of coefficients to get the value of y7;

Plot F in FIG. 11 shows that there are no images at all in continuous-time signal y6. Therefore, y6 is a "clean" continuous-time signal before it is sampled at the 16 fsout rate to generate the discrete-time signal y7.

Sampler 16 in FIG. 1 samples the continuous-time signal y6 at 16*fsout. The resampling process of resampler 16 generates a replica signal y7 of the spectrum of y6 at multiples of 16 fsout, as shown by plot G in FIG. 11. Since the sample rate ratio for asynchronous sample rate converter 1 is limited to 1:16 to 16:1, no aliasing occurs in the replica signal y7.

Figure 5:
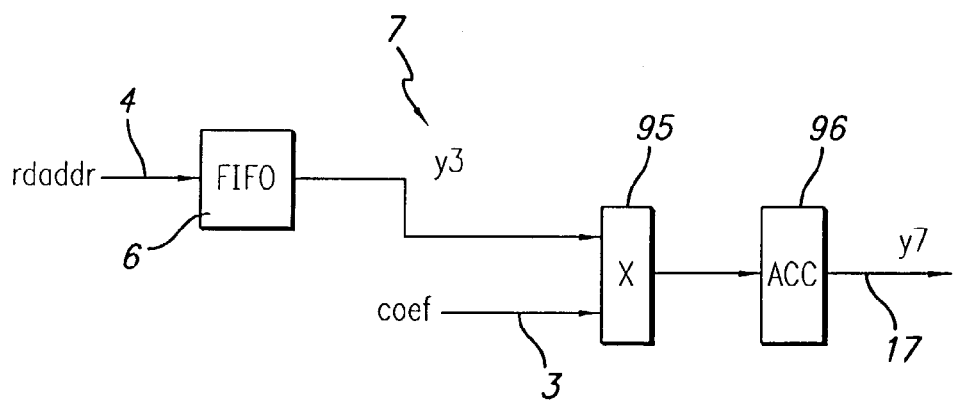
FIG. 5 is a block diagram illustrating the implementation of the third stage of interpolation and resampler circuit 7 of FIG. 1.
Figure 4A:
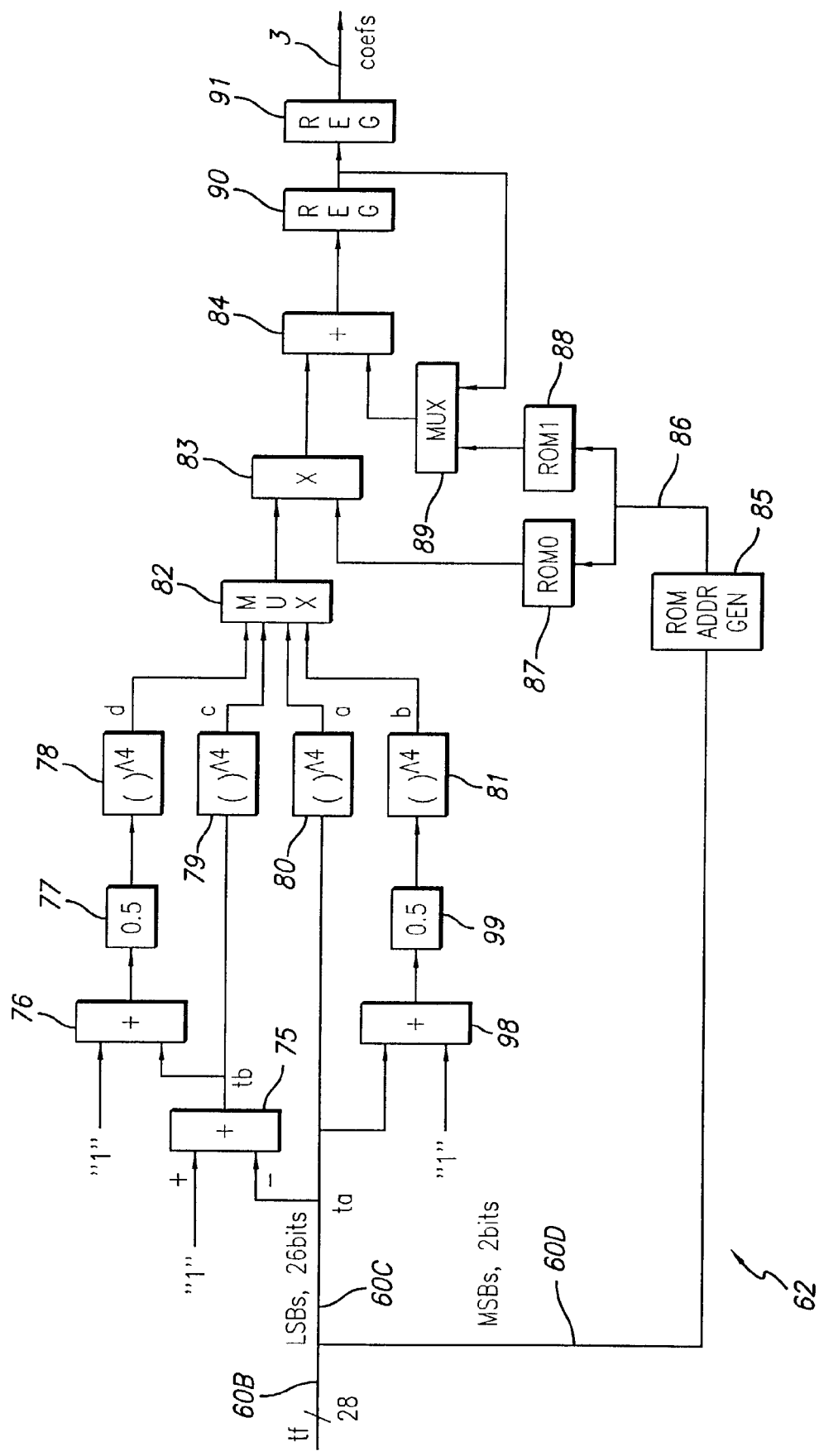
FIG. 4A is a conceptual block diagram of the coefficient generator circuit 62 for the third stage interpolation and resampler circuit 7 of FIG. 1.

Referring to FIG. 4A, the filter coefficients 3 from coefficient generator 62 and audio samples from FIFO 6 pass through a multiplier 95 and an accumulator 96 in FIG. 5, which is the information indicated by Equation (10).

FIG. 5 schematically indicates the implementation of combined interpolator and resampler circuit 7, which is a combination of third interpolation stage 8C and resampler 16. The filter coefficients 3 from coefficient generator 62 (FIG. 2) and audio samples from FIFO 6 pass through a circuit 95 and an accumulator 96, which implement the information represented by Equation (10). Circuit 95 performs a multiplying function, and circuit 95 and accumulator 96 together in effect perform the interpolation, filtering and resampling functions described with reference to the interpolation and resampling circuitry in block 7 of FIG. 1 to produce the up-sampled discrete-time signal y7 at output of the accumulator 96 relative to the output sampling rate.

Decimator 18 includes 3 stages 18A, 18B and 18C which are exactly and oppositely symmetrical to the three stages 8C, 8B and 8A of interpolator 8A,B,C. The first decimator stage 18A includes a comb filter 21, which is the same as comb filter 14 of third interpolator stage 8C, and followed by down-sampler 22. Second decimator stage 18B and third decimator stage 18C both include FIR filters followed by down-sampling by 2. When fsout is equal to or greater than fsin, direct down-sampling by 16 performed by down-sampler 19 without any filtering does not cause aliasing, as shown by plot H in FIG. 11, and reduces the overall delay through asynchronous sample rate converter 1. However, when fsout is smaller than fsin, the anti-aliasing filter, which includes filters 21, 23 and 25, has to be turned on to avoid aliasing, and the resulting signal spectrum of Audio Out signal "y" is shown as plot I in FIG. 11.

Figure 3:
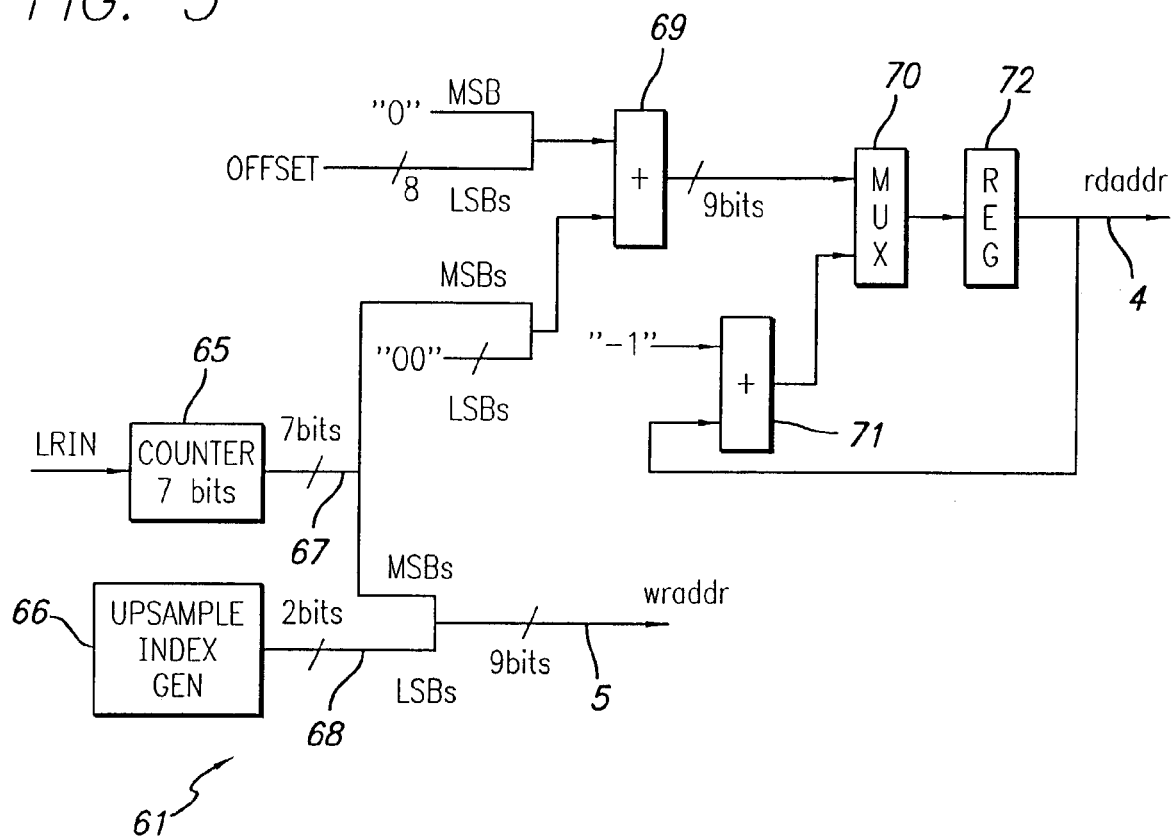
FIG. 3 is a block diagram of the FIFO access address generator circuit 61 in FIG. 2.

The details of sample rate estimator 2A are shown in FIG. 2, the details of FIFO address generator 61 are shown in FIG. 3, and the details of a conceptual implementation coefficient calculator 62 are shown in FIG. 4A.

Referring to FIG. 2, in sample rate estimator 2A, master clock signal MCLK is applied to the input of a counter 30 which produces an output that is applied to the input of a register 32 which is clocked by input sampling clock LRIN and also is applied to the input of a register 31 that is clocked by output sampling clock LROUT.

The output of register 32 is applied to the (+) input of a summing circuit 33 having a (−) input coupled to the output of an input sample rate estimate feedback loop, referred to as the "LRIN feedback loop". The output of summing circuit 33 is multiplied by a constant K1 by means of a multiplier 34, the output of which is applied to the input of an adder 36 and also to the input of another adder 35. Multiplier 34 is implemented by a shifter, since K1 is equal to 0, $2^{-8}$ or $2^{-10}$. The output of adder 36 is applied to the input of a register 37, the output of which is fed back to another input of adder 36 and also is multiplied by a constant K2 by means of a multiplier 38, the T1 output of which is applied to another input of adder 35 and to the input of a register 41. The output of adder 35 originally has a value T1, and is applied to one input of an adder 39. Adder 39 and a register 40 constitute an accumulator which is incremented by the output of adder 35. The output of adder 39 is coupled to the input of register 40, the output of which is fed back to another input of adder 39 and is also fed back to the (−) input of adder 33 and to the input of a register 42. The signal T1 is provided on the output 43 of register 41, and a signal t1 which tracks the output of register 32 is produced on the output 44 of register 42.

The output of register 31 is applied to the (+) input of a summing circuit 45 having a (−) input coupled to the output of an output sample rate estimate feedback loop, referred to as the "LROUT feedback loop". The output of summing circuit 45 is multiplied by the constant K1 by means of a multiplier 46, the output of which is applied to the input of an adder 48 and also to the input of another adder 47. The output of adder 48 is coupled to the input of a register 49, the output of which is fed back to another input of adder 48 and is also multiplied by the constant K2 by means of a multiplier 50, the output T2 of which is coupled to another input of adder 47. The output of adder 47 is divided by 16 by means of a divider circuit 51, the output of which is applied to one input of an adder 53. The output of adder 53 is coupled to the input of a register 54, the output 55 of which is fed back to another input of adder 53 and also to the (−) input of summing circuit 45. Adder 53 and register 54 constitute an accumulator 52. A signal t2 is produced on the output 55 of register 54, which is also the output of accumulator 52. The accumulator 52 runs at the rate of 16 fsout, which means that 16 values of t2 are generated for each LROUT cycle.

As shown at the bottom of FIG. 2, t1 and t2 are applied to the (−) and (+) inputs of a summing circuit 56, the output of which is multiplied by 4 (since the sampling period of y3 is T1/4) and then is applied to one input of a divider circuit 58 which receives T1 as another input. Divider circuit 58 produces an output which is applied to one input of an adder 59, the other input of which receives a phase compensation constant "phase comp". Adder 59 produces a 36-bit difference signal td on conductors 60. The eight most significant bits of difference signal td constitute an eight-bit offset signal "OFFSET" which is provided via conductors 60A as an input to FIFO address generator circuit 61 which produces read address rdaddr and write address wraddr. LRIN is applied as a clock input to FIFO address generator 61. The 28 least significant bits of td are a fractional part signal tf applied via conductors 60B to the input of coefficient calculation circuits 62, which produces the eight filter coefficients for interpolator and resampler circuit 7.

In the present implementation, the input and output sample rates can be up to 192 kHz. The frequency of MCLK is much higher, and can be up to 50 MHz. The LRIN feedback loop and the LROUT feedback loop provide low pass filtering to avoid the effects of jitter of LRIN and LROUT. The output of counter 30 is a stepped ramp signal. LRIN and LROUT clock, i.e., sample, the output of counter 30 into registers and 32 and 31, respectively. The values in registers 32 and 31 may be affected by jitter of LRIN and LROUT, so the low pass filtering is required to attenuate any errors caused by jitter. Since the loops are second-order feedback loops, t1 and t2 will accurately track the outputs of registers 32 and 31, respectively, under steady-state conditions if the jitter is not considered.

The LRIN feedback loop is updated once for each pulse of LRIN, whereas the LROUT feedback loop is updated sixteen times for each pulse of LROUT (because the sample rate of y7 is 16 fsout). t1 indicates when the first of four samples of y2 for each LRIN cycle comes in, and t2 indicates when the next value of continuous-time signal y6 is required to be re-sampled in order to generate y7. The difference of time is scaled by 4/T1 to have the time difference represented in terms of the sampling interval of the samples in the FIFO. The time difference signal td and the address of the first of four y2 samples together can be used to calculate the coefficients of interpolator and resampler circuit 7 and determine which samples in the FIFO should be used to calculate the next sample of y7.

The phase compensation is added by adder 59 so the group delay caused by the sample rate converter 1 is an integer multiple of the sampling interval when LRIN in and LROUT are perfectly in phase (i.e., LRIN in and LROUT ER virtually the same signals).

The difference signal td is a 36 bit word which is divided into an 8 bit integer part and a 28 bit fractional part. The integer part indicates how large the time difference is in terms of the number of samples in the FIFO, and the fractional part corresponds to the remaining time difference. The integer part of td is used to calculate the read address rdaddr and the fractional part of td is used to calculate the filter coefficients 3.

Referring to FIG. 1, every incoming sample of Audio In is interpolated by 4, which means that for every input sample, 4 samples of y2 are generated and written into FIFO 6. LRIN, which determines the input sample rate, clocks the 7-bit counter 65 in FIG. 3. Up-sample index generator circuit 66 operates in response to the interpolation operation to produce a 2-bit index on conductors 68 in FIG. 3 for each sample of y2 which has successive values for each sample of each group of 4 samples. That is, when the first of a group of 4 samples of y2 is produced, up-sample index generator circuit 66 produces the index 00. After each of the second, third and fourth samples of that group are produced, index generator 66 produces the indexes 01, 10, and 11, respectively. The values of the 2-bit index are combined with the 7-bit output of counter 65 to provide the write address wraddr so as to sequentially write the samples of y2 into FIFO 6.

To generate the read address rdaddr, the previously calculated 8-bit signal OFFSET is in effect added to the write address of the first sample. The resulting signal is used to decrement the accumulator 70,71,72 to produce the total of 8 of the last group of 4 samples written into FIFO 6 as the read address rdaddr. Since the signal OFFSET is the integer part of the number that represents the difference between the time the Audio In sample is received and the time at which continuous-time signal y6 is needed for resampling, read address rdaddr is used to access FIFO 6 to obtain the audio samples are that are needed next from FIFO 6. Since the audio samples have been stored sequentially in FIFO 6, this approach produces the audio samples at exactly the times they are needed in order to produce continuous-time signal y6 when it is re-sampled to produce y7. The two feedback loops have essentially the same structure, which includes a second-order feedback system (to provide zero average tracking error) and low-pass filtering.

K2 is a constant with the value $1/1024$, and there are three values for K1, namely 0, $1/256$ or $1/1024$. When K1 is set at $1/256$ vs $1/1024$, the feedback loops have a wider bandwidth which leads to faster tracking response. Therefore, $1/256$ is used for K1 when the rate estimator is in the "initial phase" or when a sample rate change is detected. K1 is switched to $1/1024$ when the estimator settles into a steady state. The mode used during the initial phase is referred to as the FAST mode, and then the mode used during the steady state is referred to as the SLOW mode. During the SLOW mode, the feedback loop has better jitter rejection and tracks the slow sample rate variation. Furthermore, when the loop is settled to within a certain threshold, K1 is set to eliminate the jitter effect completely. K1 is switched back and forth independently for each feedback loop based on its own state.

As previously indicated, the frequencies of LRIN and LROUT are fsin and fsout, respectively. The frequency fmclk of master clock MCLK is much higher than either fsin or fsout. LRIN and LROUT are used as sampling signals to sample the state of counter 30 as it is being driven by MCLK. The sampled output values of counter 30 are fed to inputs of the LRIN feedback loop and the LROUT feedback loop. Since both feedback loops are second-order feedback systems, their outputs t1 and t2 track the values of counter 30 without any steady state error. This means that t1 and t2 tend to drift around the value of counter 30, with an average error of zero. Jitter present on MCLK, LRIN and LROUT is attenuated by the two feedback loops because of their low-pass filtering characteristics.

T1 is the estimate of the input sampling interval, the value of which should be fmclk/fsin nominally, where fsmclk is the frequency of MCLK. The LRIN feedback loop operates at the frequency fsin, and the LROUT feedback loop operates at the frequency fsout. The LRIN feedback loop output t1 is updated at the rate of fsin, and can be viewed as the time stamp for the first audio sample of every four coming out of the second interpolator stage 8B (FIG. 1). The accumulator 52 at the output of the LROUT feedback loop operates at 16*fsout. The accumulator output t2 is considered as the time when an output sample should be generated by resampler 16 (FIG. 1).

The difference between t2 and t1 is divided by T1/4, and this ratio is used to access the audio samples, interpolated by 4 (i.e., up-sampled by up-samplers 9 and 11 and filtered by filters 10 and 12), and stored in FIFO 6, to calculate the 8 filter coefficients 3 for interpolator and resampler 7 of FIG. 1. For the asynchronous sample rate converter delay to be an integral number of sampling intervals when LRIN and LROUT have exactly the same frequency, phase compensation is added to the normalized time difference (t2−t1)÷(T1/4). In this way, when LRIN and LROUT are exactly in phase, the output audio sequence Audio Out will be almost the same as the input audio sequence, but will be delayed by a few samples.

Sample rate estimator 2 is designed so that t1 is always at the time of or before t2, which causes the normalized time difference td on conductors 60 to be positive or zero. The integer part of td is used as an offset on conductors 60A that indicates the location distance. of the samples in FIFO 6 to be used by interpolator and resampler 7 relative to the location of the first sample of 4 last interpolated audio samples from the second interpolator stage 8B. The term "location distance" refers to how many samples are in the FIFO for the time difference.

The fractional part tf on conductors 60B is used to calculate the 8 the filter coefficients 3.

The details of FIFO address generator 61 of sample rate estimator 2 are shown in FIG. 3. Referring to FIG. 3, input sample word clock LRIN is applied to clock a 7-bit counter 65, which produces 7 MSBs bits that are applied to one input of a digital adder 69 along with two LSBs "00" bits. The other input of adder 69 receives an MSB "0" and 8 LSBs bits having a value "OFFSET". The 9 output bits of digital adder 69 are applied to one input of a digital multiplexer 70. The output of multiplexer 70 is applied to the input of a 9-bit register 72, the output 4 of which provides the 9-bit read address signal rdaddr (9 bits for one audio channel, a 10-bit address is provided for two channels), and also is fed back to one input of an adder 71, the output of which is coupled to the other input of multiplexer 70. A "−1" signal is applied to the other input of adder 71. An up-sample index generator 66 produces a 2-bit output LSBs on conductors 68 which is combined with the 7-bit output MSBs of counter 65 to provide the 9-bit write address signal wraddr.

The value of counter 65 is also combined with "00" as LSBs. The resulting 9 bit data is added by adder 69 to the value "OFFSET", which is the 8 MSBs of td on conductors 60A in FIG. 2. The resulting 9 bit address is used as the starting address for the 8 samples to be used to generate the output of the sampler 16. Asynchronous sample rate converter 1 is designed to pre-fill FIFO 6 with 32*4 samples of y2 providing a short group delay of the signal and 64*4 samples of y2 providing a long group delay. Either of two values should be subtracted from the starting address to provide the short group delay or the long group delay, respectively.

A "conceptual" implementation of coefficient calculation circuit 62 (FIG. 2) is shown in FIG. 4A. The 28 bit signal tf on conductors 60B includes a 26-bit signal LSBs on conductors 60C which are connected to the (−) input of digital summing circuit 75, one input of a digital adder 98, and the input of an exponential circuit 80 which raises its input to the fourth power. The output "a" of circuit 80 is applied to one input of a digital multiplexer 82, the output of which is applied to one input of a digital multiplier 83. A "1" is applied to the other input of adder 98, the output of which is multiplied by 0.5 by means of a multiplier circuit 99. The output of multiplier circuit 99 is applied to the input of another fourth power exponential circuit 81, the output "b" of which is applied to another input of multiplexer 82. A "1" is applied to the (+) input of adder 75, the output tb of which is applied to one input of an adder 76 and to the input of a fourth power exponential circuit 79, the output "c" of which is applied to multiplexer 82. (Note that the "1" applied to the (+) input of adder 75 correspondents to the term "1" in the expression $t_b = 1 - t_a$ in Equations (6).) A "1" is applied to the other input of adder 76, the output of which is multiplied by 0.5 by means of multiplier circuit 77, the output of which is applied to the input of a fourth power exponential circuit 78. The output "d" of circuit 78 is applied to the last input of multiplexer 82.

The other two MSB bits of fractional part tf are the signal on conductors 60D, which constitute the signal p applied to the input of ROM (read only memory) address generator 85. The output of ROM address generator 85 is applied by conductors 86 to the inputs of a ROM 87 and a ROM 88. The output of ROM 87 is applied to the other input of multiplier 83, the output of which is applied to one input of adder 84. The output of ROM 88 is applied to one input of a multiplexer 89, the output of which is applied to the other input of adder 84. The output of adder 84 is applied to the input of a register 90, the output of which is fed back to the other input of multiplexer 89, and also is applied as an input to register 91, the output of which produces the eight filter coefficients 3.

160 constant numbers, w(i, j), are stored in two ROMs, ROM0 in block 87 and ROM1 in block 88. ROM0 stores w(i,j) for i=0, . . . , 31, j=0, . . . , 3 and ROM1 stores w(0, 4), . . . w(31,4). The 28 bit fractional part signal tf produced by sample rate estimator 2 is used to generate the 8 filter coefficients 3. The two MSBs of fractional part tf are referred to by p, and determine which one of 8 group coefficients are to be calculated. "ROM Addr Gen" circuit 85 generates the addresses for ROM 87 and ROM 88 based on the value of "p". 26 LSBs of tf are used as the signal ta on conductors 60C generate the values of a, b, c, and d. Multiply and accumulate operations are applied to the values of a, b, c, and d and w(i,j) from ROM0 and ROM1 to generate 8 coefficients.

The transfer function of Equation (2) operates at a frequency of 16 fsin. Equation (5) sets forth the calculation of continuous-time signal y6. Equations 5-8 indicate how continuous-time signal y6 is re-sampled to obtain discrete-time y7. Multiplexer 82 in FIG. 4A receives the values of a, b, c and d and sequentially applies them as the input to multiplier 83. That information is used to calculate the filter coefficients 3 by multiplying it by information from the table of values stored in ROM 87. Equation 10 indicates how y7 is calculated from y4. The 32 coefficients d0 to d31 are linear function of the values of a, b, c, and d. The coefficients w are stored in ROM 87 and ROM 88. ROM 87, ROM 88, multiplier 83 and adder 84 and multiplexer 89 are utilized to implement Equations 12.

The circuitry including adder 84, register 90, register 91 and multiplexor 89 of FIG. 4A accomplishes efficient calculation of the filter coefficients 3 by avoiding calculation of coefficients for samples which have a value of 0. Only 8 of the 32 samples have values other than 0, so only eight filter coefficients 3 actually need to be calculated.

A total of 8 coefficients are needed for each sample of y7. According to Equation (11), 8 coefficients are calculated with the following formulas:

$$t_b = 1 - t_a$$

$$a = t_a^4$$

$$b = (0.5(1+t_a))^4$$

$$c = t_b^4$$

$$d = (0.5(1+t_b))^4$$

$$coef_0 = d_p = w(p,4) + a*w(p,0) + b*w(p,1) + c*w(p,2) + d*w(p,3)$$

$$coef_1 = d_{p+4} = w(p+4,4) + a*w(p+4,0) + b*w(p+4,1) + c*w(p+4,2) + d*w(p+4,3)$$

$$coef_2 = d_{p+8} = w(p+8,4) + a*w(p+8,0) + b*w(p+8,1) + c*w(p+8,2) + d*w(p+8,3)$$

$$coef_3 = d_{p+12} = w(p+12,4) + a*w(p+12,0) + b*w(p+12,1) + c*w(p+12,2) + d*w(p+12,3)$$

$$coef_4 = d_{p+16} = w(p+16,4) + a*w(p+16,0) + b*w(p+16,1) + c*w(p+16,2) + d*w(p+16,3)$$

$$coef_5 = d_{p+20} = w(p+20,4) + a*w(p+20,0) + b*w(p+20,1) + c*w(p+20,2) + d*w(p+20,3)$$

$$coef_6 = d_{p+24} = w(p+24,4) + a*w(p+24,0) + b*w(p+24,1) + c*w(p+24,2) + d*w(p+24,3)$$

$$coef_7 = d_{p+28} = w(p+28,4) + a*w(p+28,0) + b*w(p+28,1) + c*w(p+28,2) + d*w(p+28,3)$$

where p=0, 1, 2, or 3, the value of two MSB of $t_f$ and w(.,.) are constants and stored in ROM's with w(.,4) in ROM1 and the rest in ROM0.

Figures 1, 4B:
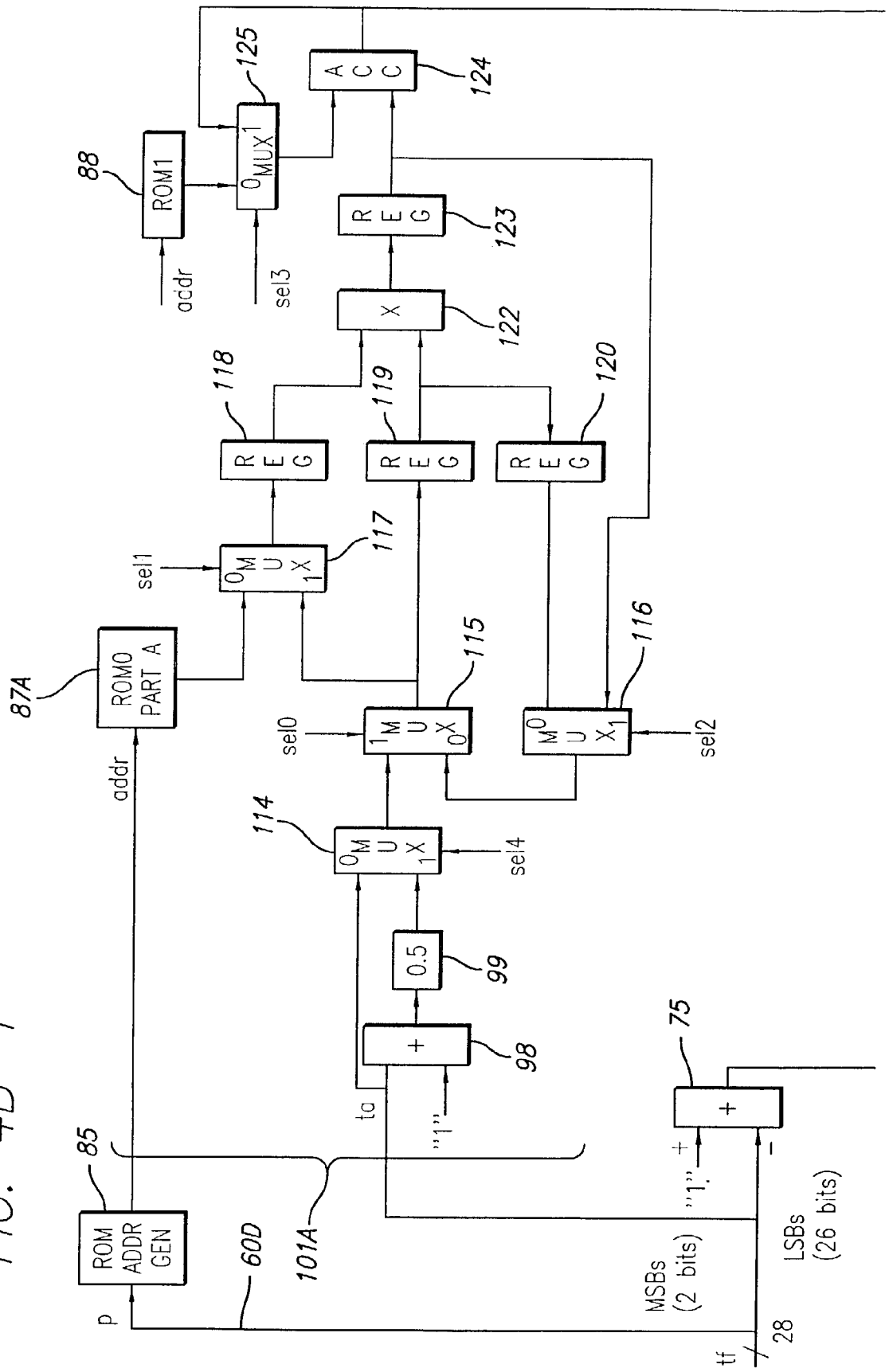
FIG. 4B is a block diagram of a preferred implementation of the coefficient generator circuit shown in FIG. 4A.

Note that FIG. 4A conceptually shows the basic coefficient calculation process using the above equations, and structure of the circuitry shown in FIG. 4A closely matches the above equations. However, the preferred physical implementation of coefficient calculation circuit 62 uses serial operations to accomplish the same thing and also save hardware. FIG. 4B is a block diagram of the preferred implementation 62A coefficient calculation circuit 62.

Referring to FIG. 4B, adders 75, 76, and 98 are connected the same as in FIG. 4A, as are multipliers 77 and 99. ROM address generator 85 in FIG. 4B is connected the same as in FIG. 4A.

The first stage 101A of coefficient calculation circuitry 62A of FIG. 4B includes adder 98 and multiplier 99. The output of multiplier 99 is connected to one input of a multiplexer 114 having its other input connected to receive the signal ta. Multiplexer 114 has a selection input sel4. The output of multiplexer 114 is connected to one input of a multiplexer 115 having a selection input sel0 and an output connected to an input of a register 119 and an input of a multiplexer 117. The other input of multiplexer 117 is connected to the output of a read only memory 87A, designated "ROM0 part A", receiving an address input addr produced by ROM address generator 85. The multiplexer 117 has a selection input sel1 and an output connected to the input of a register 118.

The other input of multiplexer 115 is connected to the output of a multiplexer 116, which has a selection input sel2. The output of register 118 is connected to one input of a digital multiplier 122 having another input connected to the output of register 119 and also to the input of a backup register 120, the output of which is connected to the other input of multiplexer 116. The output of digital multiplier 122 is connected to the input of a register 123, the output of which is connected to the other input of multiplexer 116 and also to one input of accumulator 124. The other input of accumulator 124 is connected to the output of a multiplexer 125, one input of which is connected to the output of accumulator 124. The other input of multiplexer 125 is connected to the output of a read only memory 88, which is designated "ROM1". Read only memory 88 receives an address addr produced by ROM address generator 85. Multiplexer 125 receives a selection input sel3.

The second stage 101B of coefficient calculation circuitry 62A of FIG. 4B is essentially the same as the first stage 101A, except that read only memory 87B, which is designated as "ROM0 part B", is connected to the output of ROM address generator 85, multiplexer 112 receives the output of accumulator 124 as one input, and the output of accumulator 111 is connected to the input of an output register 91, the output of which produces the filter coefficients 3.

The block diagram of FIG. 4B shows the implementation 62A used to achieve efficient calculation of the filter coefficients 3, and includes two almost identical arithmetic engines or stages. The first stage 101A, is used to calculate a and b and the summation of the first 3 terms for each coefficient. The second stage 101B, calculates c and d and completes the multiplication and accumulation of the last two terms for each coefficient. Therefore the coefficient calculation is a pipeline process.

The detailed steps for first stage 101A are as follows:

1. Put $t_a$ into both registers 118 and 119 at the input of the multiplier 122 by setting sel4 to 0, sel0 to 1 and sel1 to 1.

2. Put $0.5(1+t_a)$ into both registers 118 and 119 at the input of the multiplier 122 by setting sel4 to 1, sel0 to 1 and sel1 to 1. At this step the register 123 at the multiplier output contains $t_a^2$.

3. The properly truncated version of $t_a^2$ is put into both input registers 118 and 119 of the multiplier 122 by setting sel2 to 1, sel0 to 0 and sel1 to 1. At this step, $(0.5(1+t_a))^2$ is stored in the multiplier output register 123.

4. Repeat step 3 but the value in the input registers 118 and 119 is the truncated version of $(0.5(1+t_a))^2$ instead of $t_a^2$. At this step, $t_a^4$ is in the multiplier output register 123.

5. Put the truncated version of $t_a^4$ (i.e., truncated from the 56 bit word in register 123 resulting from the multiplication by multiplier 122 to the 28 bit width of register 119), which is the value of a, into one multiplier input register 119 by setting sel2 to 1 and sel0 to 0 and put w(p,0) from part A of ROM0 into input register 118 by setting sel1 to 0. At this step, the multiplier output register 123 contains $(0.5(1+t_a))^4$.

6. Put the truncated version of $(0.5(1+t_a))^4$, which is the value of b, into one multiplier register 119 by setting sel2 to 1 and sel0 to 0 and put w(p,1) from part A of ROM0 into input register 118 by setting sel1 to 0. The multiplier output register 123 contains a*w(p,0) and a is put into the backup register 120. 120 Set sel3 to 0 to put w(p,4) from ROM1 to the input of accumulator 124.

7. Put a from the backup register 120 into one multiplier input register 119 again by setting both sel2 and sel0 to 0 and b is put into the backup register 120. Put w(p+4,0) into the other input register 118 by setting sel1 to 0. The multiplier output register 123 contains b*w(p,1) and accumulator 124 contains w(p,4)+a*w(p,0) and set sel3 to 1 for the accumulation in the next step.

8. Put b from the backup register 120 into one multiplier input register 119 again by setting both sel2 and sel0 to 0 and a is put into the backup register 120. Put w(p+4,1) into the other input register 118 by setting sel1 to 0. The multiplier output register 123 contains a*w(p+4,0) and accumulator 124 contains w(p,4)+a*w(p,0)+b*w(p,1), which is ready to be transferred to the second stage 101B to finish the multiplication and accumulation operations for coef$_0$. Set sel3 to 0 to put w(p+4,4) at one of the inputs of accumulator 124.

9. Repeat Step7 and 8 with proper data from ROM0 and ROM1 until the multiplication and accumulation operations for all 3 terms are completed for all 8 coefficients.

The operation process for second stage 101B is similar to that for first stage 101A except that c and d are calculated, w(.,2) and w(.,3) are from part B of ROM0, and the input data to its accumulator 111 are from first stage 101A. Second stage 101B finishes the multiplication and accumulation operations for the last two terms and provide the coefficients to the arithmetic engine for the FIR filtering of interpolator and resampler 7. The second stage 101B starts two steps later than first stage 101A since second stage 101B needs to wait until first stage 101A finishes the partial multiplications and accumulations for coef$_0$.

The advantage of the foregoing pipeline process over a parallel process is that no buffer is needed to save the calculated coefficients. If the parallel process is used, the coefficients have to be saved for the later filtering by the interpolator and resampler circuitry 7 in FIG. 1, since the filtering process requires the coefficients one after another in the serial process.

Referring to FIGS. 1, 6, 8 and 11, graph A of FIG. 11 shows the Audio In signal "x" being received by asynchronous sample rate converter 1 at the input sample rate fsin. Graph B shows the received signal after the first up-sampling by 2 and filtering by filter 10 to produce y1 signals with a sample rate of 2 fsin.

Graph C of FIG. 11 shows y2 after up-sampling by 2 and filtering by filter 12 to eliminate images at 2 fsin. Graph D is the same as graph C, since y3 is the delayed version of y2.

Referring to graph E of FIG. 11, and also referring to FIG. 6, notches are present at 4 fsin, 8 fsin and 12 fsin. Any images at those notches have been filtered out, and images remain only at 16 fsin and 32 fsin, etc.. The signal y5 then goes into continuous-time filter 15, which has the frequency response shown in FIG. 8, with notches at multiples of 16 fsin. Because of those notches, all of the images are filtered out, as shown by graph F in FIG. 11, and a "clean" analog signal is produced, with only the fundamental at the zero (and near zero) frequency. The graphs in FIGS. 6 and 8 indicate where the notches occur so as to produce the filtering needed to obtain the clean analog signal in graph F of FIG. 11.

Each sample received by continuous-time filter 15 appears as an impulse and FIG. 7 shows the impulse response of continuous-time filter 15. A sequence of such impulses pass through continuous time filter 15, and the resulting sequence of impulse responses are multiplied by the corresponding sample amplitudes. The results are added together as indicated in FIG. 9, which graphically indicates how continuous-time signal y6 is obtained from the "conceptual" discrete-time signal y5.

FIG. 10 shows the frequency response of discrete-time filter 14 shown in FIG. 6 multiplied by the frequency response of continuous-time filter 15 shown in FIG. 8, which is the result when the functions of interpolator stage 8C and continuous time filter 15 of resampler 16 are combined in a single circuit as shown in block 7 of FIG. 1.

Graph G of FIG. 11 shows the frequency response obtained by sampling the clean analog signal y6 at a rate 16 fsout in order to obtain y7.

Graph H of FIG. 11 shows the Audio Out signal y if it is certain that there will be no aliasing because fsout is always greater than fsin. In this case, Audio Out is obtained merely by down-sampling the signal y7 with a sample rate of 16 fsout by 16, by means of down-sampler 19 (FIG. 1).

However, if fsout is less than fsin, then there is aliasing, which means that down-sampler 19 must be bypassed and instead the decimation filter 18 shown in FIG. 1 must be used to filter out the "would be" the aliasing signals and to accomplish the required down-sampling by 16. For this case, graph I of FIG. 11 shows the frequency spectrum of the Audio Out signal y (FIG. 1).

Figures 2, 4B:
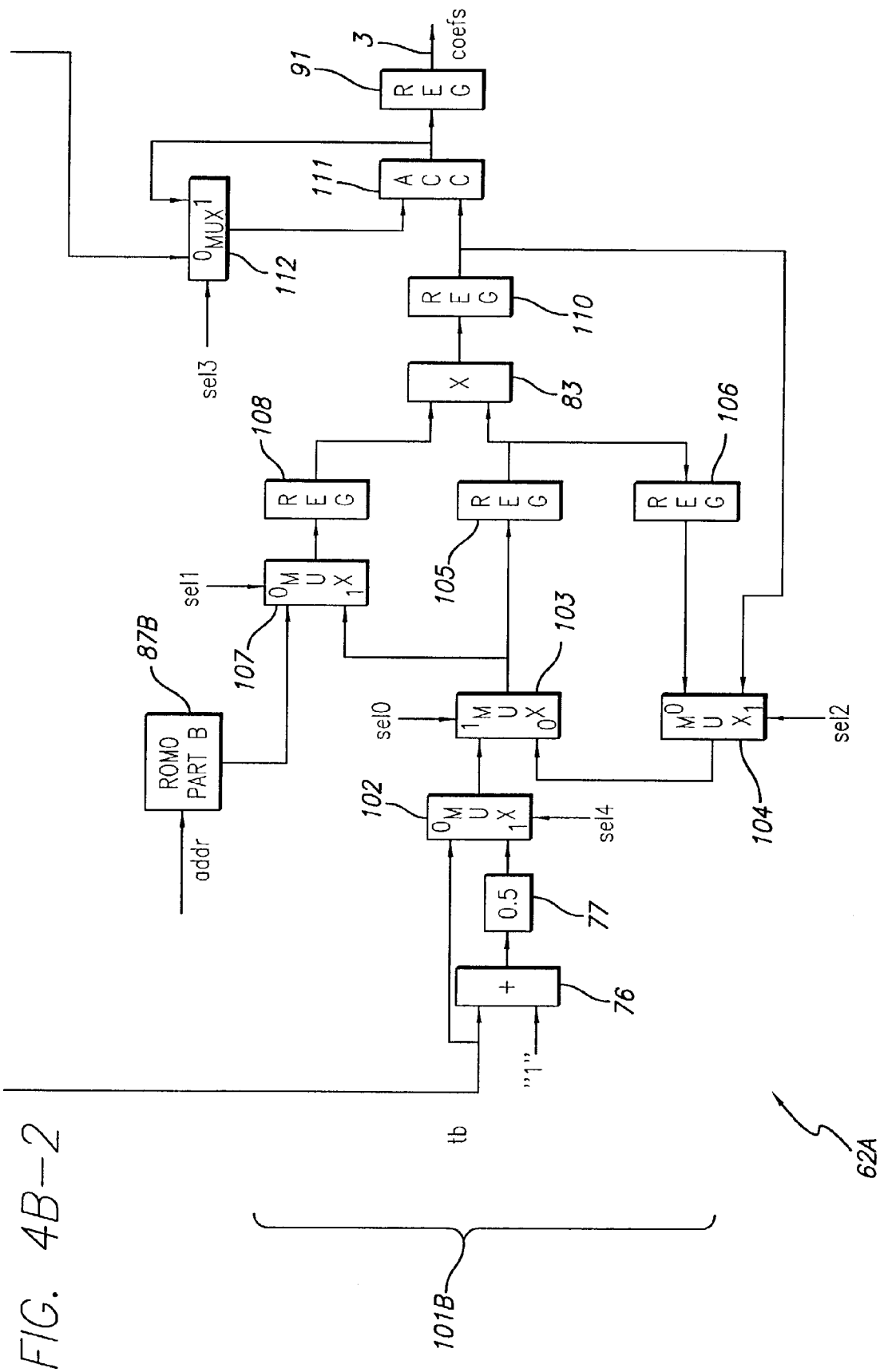

Asynchronous sample rate converter 1 of the present invention includes the above described interpolation filters, resampler and decimation filters, wherein the interpolation filters and decimation filters are by design inherently fixed and independent of input and output sample rates, and the Audio In signal and Audio Out signal of asynchronous sample rate converter 1 are phase-matched because of the operations of the rate estimator circuitry and read address and write address generation circuitry include block 2 and shown in detail and FIGS. 2-4. Therefore, multiple parallel-running asynchronous sample rate converters according to the present invention do not have to be set as master and slave and there is no phase information transfer among them.

This is in contrast to the above mentioned Analog Devices asynchronous sample rate converter, which uses a single-stage interpolation filter that interpolates the input samples by the ratio of up to $2^{16}$, resulting in a need for an undesirably long FIR lowpass filter to achieve the needed attenuation of images. In the Analog Devices asynchronous sample rate converter, a filter with 4,194,304 taps to provide 125 dB attenuation. In contrast, asynchronous sample rate converter 1 of the present invention provides attenuation the corresponding filter with more than 140 dB of attenuation, which directly improve THD+N performance. Furthermore, if the output sample rate of the Analog Devices asynchronous sample rate converter is less than the input sample rate, the interpolation filter coefficients have to be interpolated by the ratio of the output sample rate to the input sample rate to make the passband of the interpolation filter narrower to avoid aliasing. As result, the interpolation filter length and coefficients have to be recalculated based on the ratio whenever the input or output sample rate has changed. This causes the Analog Devices asynchronous sample rate converter to be very sensitive to drift of a the sample rate, especially when the output sample rate is very close to the input sample rate and also causes a substantial amount of phase mismatch for multiple parallel-running asynchronous sample rate converters even when they are put into a match phase mode in which one asynchronous sample rate converter is set as an master and the rest are set as slaves. In contrast, these difficulties are avoided by the asynchronous sample rate converter of the present invention.

While the invention has been described with reference to several particular embodiments thereof, those skilled in the art will be able to make the various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, FIFO 6 could be positioned at a different place in the interpolator, for example of the first stage or after the third stage, and if FIFO 6 is placed early in the interpolation process, then FIFO 6 could be smaller, but at the low sample rates there would not be enough time to go through all of the calculations required in the subsequent process is needed to generate y7. Positioning FIFO 6 after interpolator stages 8A,B allows them to efficiently function efficiently as a single unit, and allows third stage interpolator 8C and resampler 16 to function as a single unit efficiently. However, interpolator and resampler 16 do not necessarily have to be combined. Of course, other implementations of asynchronous sample rate converters according to the present invention could be designed to operate at different ratios of the input sample rate and at different maximum sample rates. In some cases, the samples of the audio input signal could be stored directly in the memory or FIFO.

What is claimed is:

1. An asynchronous sample rate converter comprising:
    (a) interpolation and filter circuitry for interpolating and filtering an audio input signal to produce a filtered, up-sampled first signal;
    (b) a memory for receiving the first signal and storing samples thereof and presenting stored samples from locations of the memory determined by a read address;
    (c) interpolation and resampling circuitry for operating on the presented samples to produce a continuous-time signal which is resampled to produce a discrete-time signal that is up-sampled relative to a desired output signal;
    (d) down-sampling and filtering circuitry for operating on the discrete-time signal to produce an output signal;
    (e) sample rate estimating circuitry for computing a difference signal representative of a time at which a data sample of the audio input signal is received and a time at which a corresponding audio output sample is required;
    (f) address generation circuitry for generating the read address in response to the difference signal; and
    (g) coefficient calculation circuitry for calculating filter coefficients for the interpolation and resampling circuitry in response to the difference signal.

2. An asynchronous sample rate converter, comprising:
    (a) interpolation and filtering circuitry for receiving a digital audio input signal having an input sample rate and producing a filtered, up-sampled first signal having a first sample rate;
    (b) a memory for receiving the first signal and storing samples thereof at locations determined by a write address and presenting stored samples from locations determined by a read address;
    (c) interpolation and resampling circuitry for up-sampling and filtering the presented stored samples to produce a continuous-time signal and for resampling the continuous-time signal to produce an up-sampled discrete-time signal;
    (d) a decimation filter for filtering and down-sampling the discrete-time signal to produce an audio output signal having an output sampling rate;
    (e) sample rate estimating circuitry responsive to a main clock, an input sample rate clock, and an output sample rate clock for computing a difference signal representative of a time at which a data sample of the audio input signal is received and a time at which a corresponding audio output sample is required, the difference signal including an integer part and a fractional part;
    (f) address generation circuitry responsive to an input sampling clock and the integer part for generating the read address and the write address; and
    (g) coefficient calculation circuitry responsive to the fractional part for calculating filter coefficients for the interpolation and resampling circuitry.

3. The asynchronous sample rate converter of claim 2 wherein the sample rate estimating circuitry includes:
    a first counter clocked by a main clock signal for producing a first stepped ramp signal, a first register clocked by the input sampling clock for loading the first stepped ramp signal into the first register, and a second register clocked by the output sampling clock for loading the first stepped ramp output signal into the second register;
    a first feedback loop coupled to receive a second stepped ramp signal from an output of the first register for filtering the second stepped ramp signal to eliminate jitter of the input sampling clock and to produce a first input sampling interval estimate signal and a first time stamp signal corresponding to the time of occurrence of the first sample of each group of N samples of the first signal, N being an integer;
    a second feedback loop coupled to receive a third stepped ramp signal from an output of the second register for filtering the third stepped ramp signal to eliminate jitter of the output sampling clock and to produce a second time stamp signal corresponding to when a next resampling of the continuous-time signal should occur; and
    difference circuitry receiving the first and second time stamp signals for producing the difference signal in response to the first and second time stamp signals.

4. The asynchronous sample rate converter of claim 3 wherein the sample rate estimating circuitry includes difference circuitry receiving the first and second time stamp signals and the first input sampling interval estimate signal for producing the difference signal in response the first and second time stamp signals and the first sampling interval estimate signal.

5. The asynchronous sample rate converter of claim 4 wherein the address generation circuitry includes:
    a second counter clocked by the input sample rate clock and providing a digital output,
    a first adder combining the digital output of the second counter with the integer part to provide a digital word that is input to an accumulator to produce the read address, and
    an index generating circuit providing a digital index that is incremented to indicate sequential samples of a each of a plurality of predetermined groups of samples of the first signal in order to produce sequential values of the write address corresponding to sequential samples of the first signal, the digital index being applied to an input of the first adder.

6. The asynchronous sample rate converter of claim 4 wherein the memory is a random access memory having an input bus coupled to receive the first signal and store samples thereof at memory locations determined by the write address and also having an output bus onto which data stored in the random access memory is read from memory locations determined by the read address.

7. The asynchronous sample rate converter of claim 6 wherein the memory is a FIFO memory.

8. The asynchronous sample rate converter of claim 4 wherein the coefficient calculation circuitry includes:
    a first adder, a first exponential circuit, and a second adder all receiving an LSB portion of the difference signal, each of the first and second adders also receiving a "1" input, the first exponential circuit producing a first exponential signal;

a read only memory address generator receiving an MSB portion of the fractional part;

a second exponential circuit receiving a scaled output of the second adder and producing a second exponential signal;

a third exponential circuit and a third adder receiving an output of the first adder, the third exponential circuit producing a third exponential signal;

a fourth exponential circuit receiving a scaled output from the third adder and producing a fourth exponential signal;

a first multiplexer sequentially applying the first, second, third and fourth exponential signals to an input of a multiplier;

the read only memory address generator producing addresses in first and second read only memories, the first read only memory applying signals to another input of the multiplier, the second read only memory applying an output to an input of a second multiplexer; and outputs of the multiplier and the second multiplexer being added by a fourth adder and loaded into a register, outputs of which represent the filter coefficients and are fed back to another input of the second multiplexer.

9. The asynchronous sample rate converter of claim 2 wherein the interpolation and resampling circuitry produces the up-sampled discrete-time signal according to the equations $$y_7(mT_3) = d_0 y_4(nT) + \mathrm{i}\, d_1 y_4((n-1)T) + \ldots + d_{31} y_4((n-31)T)$$

where d0, d1, ..., d31 are linear functions of a, b, c, and d as follows:

$$d_0 = a*w(0,0) + b*w(0,1) + c*w(0,2) + d*w(0,3) + w(0,4)$$
$$d_1 = a*w(1,0) + b*w(1,1) + c*w(1,2) + d*w(1,3) + w(1,4)$$
$$\vdots$$
$$d_{31} = a*w(31,0) + b*w(31,1) + c*w(31,2) + d*w(31,3) + w(31,4)$$

10. The asynchronous sample rate converter of claim 9 wherein the interpolation and resampling circuitry includes interpolation and filtering circuitry for receiving the presented stored samples and the filter coefficients, and an accumulator circuit receiving an output of the interpolation and filtering circuitry and producing the up-sampled discrete-time signal.

11. The asynchronous sample rate converter of claim 2 wherein the interpolation and filtering circuitry includes a first stage for up-sampling and filtering the audio input signal followed by a second stage for up-sampling and filtering an output of the first stage to produce the first signal.

12. The asynchronous sample rate converter of claim 3 wherein the address generation circuitry includes a second counter clocked by the input sample rate clock and providing a digital output, a first adder combining the digital output of the second counter with the integer part to provide a digital word that is input to an accumulator to produce the read address, and an index generating circuit providing a digital index that is incremented to indicate sequential samples of a each of a plurality of predetermined groups of samples of the first signal in order to produce sequential values of the write address corresponding to sequential samples of the first signal.

13. The asynchronous sample rate converter of claim 3 wherein the coefficient calculation circuitry includes a first adder, a first exponential circuit, and a second adder all receiving an LSB portion of the difference signal, each address also receiving a "1" input, the first exponential circuit producing a first exponential signal, a read only memory address generator receiving an MSB portion of the fractional part, a second exponential circuit receiving a scaled output of the second adder and producing a second exponential signal, a third exponential circuit and the third adder receiving an output of the first adder, the third exponential circuit producing a third exponential signal, a fourth exponential circuit receiving a scaled output from a third adder and producing a fourth exponential signal, a first multiplexer sequentially applying the first, second, third and fourth exponential signals to an input of a multiplier, the read only memory address generator producing addresses in first and second read only memories, the first read only memory applying signals to another input of the multiplier, the second read only memory applying an output to an input of a second multiplexer, and outputs of the multiplier and the second multiplexer being added by a fourth adder and loaded into a register, outputs of which represent the filter coefficients and are fed back to another input of the second multiplexer.

14. The asynchronous sample rate converter of claim 10 wherein the coefficient calculation circuit includes a pipeline circuit including a first stage for producing the quantities a and b and a second stage for producing the quantities c and d.

15. A method of asynchronously converting an input signal having a first sample rate to an output signal having a second sample rate, comprising:

(a) computing a difference signal representative of a time at which a data sample of the input signal is received and a time at which a corresponding output sample is required;

(b) generating read addresses in response to the difference signal;

(c) calculating filter coefficients for interpolation and resampling circuitry in response to the difference signal;

(d) storing samples representative of the input signal in a memory, and presenting stored samples retrieved from locations of the memory determined by the read addresses to the interpolation and resampling circuitry;

(e) interpolating, filtering and resampling the presented samples to produce a continuous-time signal which is resampled to produce a discrete-time signal that is up-sampled relative to the output signal; and (f) down-sampling the discrete-time signal to produce the output signal.

16. A method of asynchronously converting an input signal having a first sample rate to an output signal having a second sample rate, comprising:

(a) interpolating and filtering the input signal to produce a filtered, up-sampled first signal;

(b) computing a difference signal representative of a time at which a data sample of the input signal is received and a time at which a corresponding output sample is required;

(c) generating read addresses in response to the difference signal;

(d) calculating filter coefficients for interpolation and resampling circuitry in response to the difference signal;

(e) storing samples of the first signal in a memory, and presenting stored samples from locations of the memory determined by the read addresses to the interpolation and resampling circuitry;

(f) up-sampling and filtering the presented samples to produce a continuous-time signal and resampling the continuous-time signal to produce a discrete-time signal that is up-sampled relative to the output signal; and (g) down-sampling and filtering the discrete-time signal to produce the output signal.

17. The method of claim 16 wherein the interpolating and filtering of step (f) is performed in accordance with the filter coefficients.

18. A method of operating an asynchronous sample rate converter, comprising:

(a) interpolating and filtering a digital audio input signal having an input sample rate to produce a filtered, up-sampled first signal having a first sample rate;

(b) computing a difference signal representative of a time at which a data sample of the input signal is received and a time at which a corresponding output sample is required, the difference signal including an integer part and a fractional part;

(c) generating a read address in response to an input sampling clock and the integer part;

(d) calculating filter coefficients for interpolation and resampling circuitry;

(e) storing samples of the first signal in a memory, and presenting stored samples from locations of the memory determined by the read address to interpolation and resampling circuitry;

(f) up-sampling and filtering the presented stored samples to produce a continuous-time signal, and resampling the continuous-time signal to produce an up-sampled discrete-time signal; and (g) filtering and down-sampling the discrete-time signal to produce an audio output signal having an output sampling rate.

19. The method of claim 18 wherein step (b) is performed by means of sample rate estimating circuitry including:

a first counter clocked by a main clock signal for producing a first stepped ramp signal, a first register clocked by the input sampling clock, the method including loading the first stepped ramp signal into the first register;

a second register clocked by the output sampling clock, the method including loading the first stepped ramp output signal into the second register;

a first feedback loop coupled to receive a second stepped ramp signal from an output of the first register, the method including filtering the second stepped ramp signal to eliminate jitter of the input sampling clock and to produce a first input sampling interval estimate signal and a first time stamp signal corresponding to the time of occurrence of the first sample of each group of N samples of the first signal, N being an integer:

a second feedback loop coupled to receive a third stepped ramp signal from an output of the second register, the method including filtering the third stepped ramp signal to eliminate jitter of the output sampling clock and to produce a second time stamp signal corresponding to when a next resampling of the continuous-time signal should occur; and difference circuitry receiving the first and second time stamp signals, the method including producing the difference signal in response to the first and second time stamp signals by means of the difference circuitry.

20. The method of claim 19 wherein difference circuitry also receives the first input sampling interval estimate signal, the method including producing the difference signal in response the first and second time stamp signals and the first input sampling interval estimate signal.

21. The method of claim 18 wherein the address generation circuitry includes:

a second counter clocked by the input sample rate clock, the method including operating the second counter to provide a digital output;

a first adder combining the digital output of the second counter with the integer part, the method including operating the first adder to provide a digital word that is input to an accumulator to produce the read address; and an index generating circuit, the method including operating the index generating circuit to provide a digital index that is incremented to indicate sequential samples of a each of a plurality of predetermined groups of samples of the first signal in order to produce sequential values of the write address corresponding to sequential samples of the first signal.

22. The method of claim 21 wherein the coefficient calculation circuitry includes:

a first adder, a first exponential circuit, and a second adder each receiving an LSB portion of the difference signal, each of the first and second addresses also receiving a "1" input, the method including operating the first exponential circuit to produce a first exponential signal;

a read only memory address generator receiving an MSB portion of the fractional part;

a second exponential circuit receiving a scaled output of the second adder, the method including operating the second exponential circuit to produce a second exponential signal;

a third exponential circuit and the third adder receiving an output of the first adder, the method including operating the third exponential circuit to produce a third exponential signal;

a fourth exponential circuit receiving a scaled output from the third adder, the method including operating the fourth exponential circuit to produce a fourth exponential signal;

the method including sequentially applying the first, second, third and fourth exponential signals to an input of a multiplier;

the method including operating the read only memory address generator to produce addresses in first and second read only memories, the first read only memory applying signals to another input of the multiplier, the second read only memory applying an output to an input of a second multiplexer; and outputs of the multiplier and the second multiplexer being added by a fourth adder and loaded into a register, outputs of which represent the filter coefficients and are fed back to another input of the second multiplexer.

23. The method of claim 18 including operating the interpolation and resampling circuitry to produce the up-sampled discrete-time signal according to the equations $$y_7(mT_3) = d_0 y_4(nT) + d_1 y_4((n-1)T) + \ldots + d_{31} y_4((n-31)T)$$

where d0, d1, ..., d31 are linear functions of a, b, c, and d as follows:

$$d_0 = a*w(0,0) + b*w(0,1) + c*w(0,2) + d*w(0,3) + w(0,4)$$
$$d_1 = a*w(1,0) + b*w(1,1) + c*w(1,2) + d*w(1,3) + w(1,4)$$
$$\vdots$$
$$d_{31} = a*w(31,0) + b*w(31,1) + c*w(31,2) + d*w(31,3) + w(31,4)$$

24. The method of claim 18 wherein the address generation circuitry includes:

a second counter clocked by the input sample rate clock and providing a digital output;

a first adder, the method including operating the first adder to combining the digital output of the second counter with the integer part to provide a digital word that is input to an accumulator to produce the read address; and the method includes operating an index generating circuit to provide a digital index that is incremented to indicate sequential samples of a each of a plurality of predetermined groups of samples of the first signal in order to produce sequential values of the write address corresponding to sequential samples of the first signal.

* * * * *